(12) United States Patent
Adam et al.

(10) Patent No.: US 9,219,139 B2
(45) Date of Patent: Dec. 22, 2015

(54) SEMICONDUCTOR DEVICES HAVING FIN STRUCTURES, AND METHODS OF FORMING SEMICONDUCTOR DEVICES HAVING FIN STRUCTURES

(71) Applicant: GLOBALFOUNDRIES INC., Grand Cayman (KY)

(72) Inventors: Thomas N. Adam, Slingerlands, NY (US); Kangguo Cheng, Schenectady, NY (US); Ali Khakifirooz, Mountain View, CA (US); Alexander Reznicek, Mount Kisco, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/081,320

(22) Filed: Nov. 15, 2013

(65) Prior Publication Data
US 2014/0070332 A1    Mar. 13, 2014

Related U.S. Application Data

(62) Division of application No. 13/448,749, filed on Apr. 17, 2012, now Pat. No. 8,652,932.

(51) Int. Cl.
*H01L 21/02* (2006.01)
*H01L 29/78* (2006.01)
*H01L 29/66* (2006.01)
*H01L 21/20* (2006.01)

(52) U.S. Cl.
CPC ............... *H01L 29/78* (2013.01); *H01L 21/20* (2013.01); *H01L 29/66477* (2013.01); *H01L 29/66545* (2013.01); *H01L 29/66795* (2013.01); *H01L 29/785* (2013.01); *H01L 21/0262* (2013.01); *H01L 21/02532* (2013.01)

(58) Field of Classification Search
CPC ............... H01L 29/7869; H01L 29/78; H01L 21/02532; H01L 21/76877; H01L 29/785; H01L 21/02164; H01L 21/76802; H01L 27/088; H01L 27/124; H01L 29/165; H01L 29/66545; H01L 29/66795; H01L 29/7848
See application file for complete search history.

(56) References Cited

U.S. PATENT DOCUMENTS

| | | |
|---|---|---|
| 6,251,751 B1 | 6/2001 | Chu et al. |
| 6,855,990 B2 | 2/2005 | Yeo et al. |
| 7,060,539 B2 | 6/2006 | Chidambarrao et al. |

(Continued)

OTHER PUBLICATIONS

PCT/ISA/220 Notification of Transmittal of the International Search Report and the Written Opinion of the International Searching Authority, or the Declaration dated Jul. 26, 2013, International Application No. PCT/US2013/036854.

*Primary Examiner* — Robert Bachner
(74) *Attorney, Agent, or Firm* — Scully, Scott, Murphy & Presser, P.C.

(57) ABSTRACT

A semiconductor device including at least two fin structures on a substrate surface and a functional gate structure present on the at least two fin structures. The functional gate structure includes at least one gate dielectric that is in direct contact with at least the sidewalls of the two fin structures, and at least one gate conductor on the at least one gate dielectric. The sidewall of the gate structure is substantially perpendicular to the upper surface of the substrate surface, wherein the plane defined by the sidewall of the gate structure and a plane defined by an upper surface of the substrate surface intersect at an angle of 90°+/−5°. An epitaxial semiconductor material is in direct contact with the at least two fin structures.

15 Claims, 17 Drawing Sheets

(56) References Cited

U.S. PATENT DOCUMENTS

| | | |
|---|---|---|
| 7,091,566 B2 | 8/2006 | Zhu et al. |
| 7,300,837 B2 | 11/2007 | Chen et al. |
| 7,393,768 B2 | 7/2008 | Degroote |
| 7,820,513 B2 | 10/2010 | Hareland et al. |
| 7,923,337 B2 | 4/2011 | Chang et al. |
| 8,030,163 B2 | 10/2011 | Pillarisetty et al. |
| 2007/0034971 A1 | 2/2007 | Anderson et al. |
| 2007/0287256 A1 | 12/2007 | Chang et al. |
| 2008/0303096 A1 | 12/2008 | Schulz |
| 2009/0061572 A1* | 3/2009 | Hareland et al. ............ 438/157 |
| 2010/0133615 A1 | 6/2010 | Mulfinger et al. |
| 2011/0042744 A1* | 2/2011 | Cheng et al. ................. 257/347 |
| 2011/0089493 A1 | 4/2011 | Lander |
| 2011/0124170 A1 | 5/2011 | Grupp et al. |
| 2011/0237046 A1 | 9/2011 | Maszara et al. |
| 2011/0298061 A1 | 12/2011 | Siddiqui et al. |

\* cited by examiner

SEMICONDUCTOR DEVICES HAVING FIN STRUCTURES, AND METHODS OF FORMING SEMICONDUCTOR DEVICES HAVING FIN STRUCTURES

CROSS REFERENCE TO RELATED APPLICATION

This application is a divisional of U.S. patent application Ser. No. 13/448,749, filed Apr. 17, 2012 the entire content and disclosure of which is incorporated herein by reference.

BACKGROUND

The present disclosure relates generally to semiconductor devices. More particularly, the present disclosure relates to scaling of semiconductor devices.

In order to be able to make integrated circuits (ICs), such as memory, logic, and other devices, of higher integration density than currently feasible, one has to find ways to further downscale the dimensions of field effect transistors (FETs), such as metal-oxide-semiconductor field effect transistors (MOSFETs) and complementary metal oxide semiconductors (CMOS). Scaling achieves compactness and improves operating performance in devices by shrinking the overall dimensions and operating voltages of the device while maintaining the device's electrical properties.

SUMMARY

A method of fabricating a semiconductor device is provided that, in one embodiment, includes forming an epitaxial semiconductor material on sidewalls of at least one fin structure that is present on a dielectric surface, wherein the at least one fin structure has a first composition that is different from a second composition of the epitaxial semiconductor material. A replacement gate structure is then formed on a channel portion of the at least one fin structure. An interlevel dielectric layer is then formed over an exposed portion of the at least one fin structure, wherein the interlevel dielectric layer has an upper surface that is coplanar with an upper surface of the replacement gate structure. The replacement gate structure is then removed with an etch that is selective to at least the at least one fin structure and the epitaxial semiconductor material, wherein removing the replacement gate structure provides a first opening to the at least one fin structure. An exposed portion of the epitaxial semiconductor material is removed with an anisotropic etch to provide a second opening that terminates on the dielectric surface. A functional gate structure is formed filling at least a portion of the first opening and the second opening.

In another embodiment, a method of fabricating a semiconductor device is provided that includes forming an epitaxial semiconductor material on sidewalls of at least one fin structure that is present on a dielectric surface, wherein the at least one fin structure has a first composition that is different from a second composition of the epitaxial semiconductor material. A replacement gate structure is then formed on a channel portion of the at least one fin structure. An interlevel dielectric layer is then formed over an exposed portion of the at least one fin structure, wherein the interlevel dielectric layer has an upper surface that is coplanar with an upper surface of the replacement gate structure. The replacement gate structure is then removed with an etch that is selective to at least the at least one fin structure and the epitaxial semiconductor material, wherein removing the replacement gate structure provides a first opening to the at least one fin structure. An exposed portion of the epitaxial semiconductor material is removed with an anisotropic etch to provide a second opening that terminates on the dielectric surface. An isotropic etch is applied to the second opening that etches the epitaxial semiconductor material and is selective to at least the interlevel dielectric layer and the at least one fin structure, wherein the isotropic etch increases a width of the second opening. A conformal dielectric layer having a first dielectric constant is applied to the second opening following by anisotropic etch. A functional gate structure is formed filling at least a portion of the first opening and the second opening, wherein the functional gate structure includes a gate dielectric having a second dielectric constant, wherein the second dielectric constant is greater than the first dielectric constant.

In another aspect, a semiconductor device is provided that includes at least two fin structures, and a gate structure present on the at least two fin structures. The gate structure includes at least one high-k gate dielectric that is in direct contact with at least sidewalls of the two fin structures, and at least one gate conductor on the at least one high-k gate dielectric. A dielectric spacer extends from a first fin structure to an adjacent fin structure and has an upper surface that is substantially coplanar with an upper surface of the at least two fin structures. The dielectric spacer has a dielectric constant that is less than the dielectric constant of the high-k gate dielectric. The dielectric spacer may also be in direct contact with the at least one high-k gate dielectric of the gate structure. An epitaxial semiconductor material is in direct contact with the at least two fin structures and is separated from the gate structure by the dielectric spacer.

In yet another embodiment, a method of fabricating a semiconductor device is provided that includes epitaxially forming a sacrificial semiconductor material on at least two fin structures. The sacrificial semiconductor material may extend from a first sidewall of a first fin structure to a second sidewall of an adjacent fin structure of the at least two fin structures. A replacement gate structure is formed on a channel portion of each of the at least two fin structures. The sacrificial semiconductor material may be anisotropically etched selectively to at least the replacement gate structure and the at least two fin structures, wherein a remaining portion of the sacrificial semiconductor material is present underlying the replacement gate structure. A dielectric spacer is formed on the sidewalls of the replacement gate structure and the remaining portion of the sacrificial semiconductor material. The replacement gate structure and the remaining semiconductor material may be removed to provide an opening to a channel portion to each of the at least two fin structures. A functional gate structure may be formed in the opening to the channel portion of the at least two fin structures.

In another aspect, a semiconductor device is provided that includes at least two fin structures on a substrate and a functional gate structure present on the at least two fin structures. The functional gate structure includes at least one gate dielectric that is in direct contact with at least the sidewalls of the two fin structures, and at least one gate conductor on the at least one gate dielectric. The sidewall of the functional gate structure is substantially perpendicular to the upper surface of the dielectric surface, wherein the plane defined by the sidewall of the functional gate structure and a plane defined by an upper surface of the substrate surface intersect at an angle of 90°+/−5°. An epitaxial semiconductor material is in direct contact with the at least two fin structures.

In another embodiment, a method of forming a semiconductor device is provided that includes forming at least two fin structures comprised of a first semiconductor material on a substrate, and epitaxially forming a sacrificial semiconductor material of a second semiconductor material on the at least two fin structures. The sacrificial semiconductor material extends from a first sidewall of a first fin structure to a second sidewall of an adjacent fin structure of the at least two fin structures. A replacement gate structure is formed on a channel portion of each of the at least two fin structures. The sacrificial semiconductor material is anisotropically etched selectively to at least the replacement gate structure and the at least two fin structures, wherein a remaining portion of the sacrificial semiconductor material is present underlying the replacement gate structure. The at least two fin structures and the remaining portion of the sacrificial semiconductor material are then oxidized to form a first oxide on the remaining portion of the sacrificial semiconductor material and a second oxide on the at least two fin structures. The first thickness of the first oxide is greater than the second thickness of the second oxide. The second oxide may then be removed. An interlevel dielectric layer is then formed over an exposed portion of the at least one fin structure, wherein the interlevel dielectric layer has an upper surface that is coplanar with an upper surface of the replacement gate structure. The replacement gate structure and the remaining semiconductor material are removed to provide an opening to a channel portion to each of the at least two fin structures. A functional gate structure is then formed in the opening to the channel portion of the at least two fin structures.

In another aspect, a semiconductor device is provided, which in one embodiment includes at least two fin structures and a gate structure that is present on the at least two fin structures. The gate structure includes at least one gate dielectric that is in direct contact with at least the sidewalls of the two fin structures, and at least one gate conductor on the at least one gate dielectric. A dielectric spacer of a germanium-containing oxide extends from a first fin structure to an adjacent fin structure and has an upper surface that is substantially coplanar with an upper surface of the at least two fin structures. The dielectric spacer is in direct contact with the at least one dielectric of the gate structure. An epitaxial semiconductor material may be in direct contact with the at least two fin structures and separated from the gate structure by the dielectric spacer.

DESCRIPTION OF SEVERAL VIEWS OF THE DRAWINGS

The following detailed description, given by way of example and not intended to limit the present disclosure solely thereto, will best be appreciated in conjunction with the accompanying drawings, wherein like reference numerals denote like elements and parts, in which.

DETAILED DESCRIPTION

Figure 1:
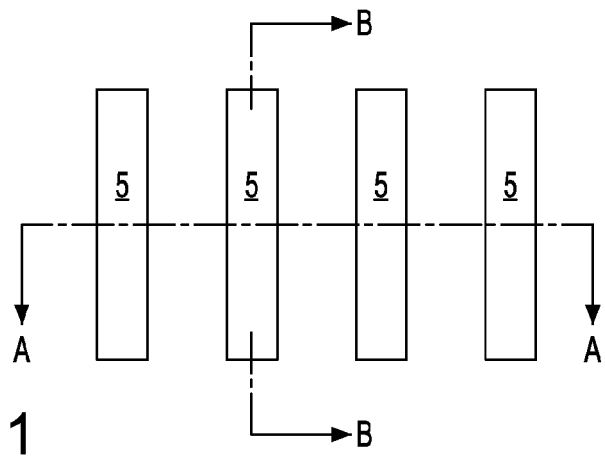
FIG. 1 is a top down perspective view of four fin structures that are present on a substrate surface, in accordance with one embodiment of the present disclosure.

Detailed embodiments of the methods and structures of the present disclosure are described herein; however, it is to be understood that the disclosed embodiments are merely illustrative of the disclosed methods and structures that may be embodied in various forms. In addition, each of the examples given in connection with the various embodiments of the disclosure are intended to be illustrative, and not restrictive. References in the specification to "one embodiment", "an embodiment", "an example embodiment", etc., indicate that the embodiment described may include a particular feature, structure, or characteristic, but every embodiment may not necessarily include the particular feature, structure, or characteristic.

Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. For purposes of the description hereinafter, the terms "upper", "lower", "top", "bottom", and derivatives thereof shall relate to the disclosed structures, as they are oriented in the drawing figures. The terms "overlying", or "positioned on" means that a first element, such as a first structure, is present on a second element, such as a second structure, wherein intervening elements, such as an interface structure, e.g., interface layer, may be present between the first element and the second element. The term "direct contact" means that a first element, such as a first structure, and a second element, such as a second structure, are connected without any intermediary conducting, insulating or semiconductor layers at the interface of the two elements.

The methods and structures disclosed herein are directed to three dimensional semiconductor devices, such as finFET semiconductor devices and tri-gate semiconductor devices. FinFET and tri-gate semiconductor devices typically have three terminals, i.e., a functional gate structure, a source region and a drain region. The functional gate structure controls output current, i.e., flow of carriers in the channel region. The channel region is the region between the source region and the drain region of the transistor that becomes conductive when the transistor is turned on. Typically and in a finFET, the functional gate structure is in direct contact with the sidewall of a fin structure that provides the channel region of the semiconductor device. A fin structure is an island of semiconductor material that has a height that is greater than its width. A tri-gate semiconductor device is similar to a finFET semiconductor device. The tri-gate semiconductor device differs from a finFET semiconductor device, because the functional gate structure of the tri-gate semiconductor device is in direct contact with the upper surface and sidewall surfaces of the fin structure that contain the channel region. In a finFET semiconductor device, a dielectric fin cap that is atop the fin structure obstructs the direct contact of the functional gate structure to the upper surface of the fin structure that contains the channel.

FinFET and tri-gate semiconductor devices may be suitable for increased scaling of semiconductor devices, however the 3D geometry of FinFET and tri-gate semiconductor devices impose several integration challenges. For example, it has been determined that due to differences in the topography of these devices, it is difficult to define a straight gate conductor with a same gate length at the top and bottom of the device. Further, replacement gate methods to form the functional gate structure to finFET and tri-gate semiconductor devices pose additional challenges. For example, in some instances, it can be difficult to remove the components of the replacement gate structure from the space between the fin structures, and it can be difficult to form epitaxial semiconductor material in the source and drain regions to merge the fin structures.

It has been discovered that the aforementioned disadvantages result from a difference in topography between the upper surface of the fin structure and the substrate, e.g., dielectric surface, on which the fin structure is formed. In some embodiments, the methods and structures of the present disclosure overcome the aforementioned disadvantages, by forming an epitaxial semiconductor material, which may be sacrificial, between the fin structures before forming the replacement gate structure. The epitaxial semiconductor material has an upper surface that is substantially coplanar with the upper surface of the fin structures. Therefore, a substantially planar surface, i.e., a surface having minimized topography variation, is provided for a following replacement gate process.

FIGS. 1-8C depict one embodiment of a method of fabricating a semiconductor device that includes forming an epitaxial semiconductor material 10 on the sidewalls S1 of at least one fin structure 5 that is present on a dielectric surface 4, wherein the at least one fin structure 5 has a first composition that is different from a second composition of the epitaxial semiconductor material 10. A replacement gate structure 15 is then formed on a channel portion of the at least one fin structure 5. An interlevel dielectric layer is then formed over an exposed portion of the at least one fin structure 5, wherein the interlevel dielectric layer 20 has an upper surface that is coplanar with an upper surface of the replacement gate structure 15. The replacement gate structure 15 is then removed with an etch that is selective to at least the at least one fin structure 5 and the epitaxial semiconductor material 10, wherein removing the replacement gate structure 15 provides a first opening 25 to the at least one fin structure 5. An exposed portion of the epitaxial semiconductor material 10 is removed with an anisotropic etch to provide a second opening 30 that terminates on the dielectric surface 4. A functional gate structure 35 may then be formed filling at least a portion of the first opening 25 and the second opening 30. The details of this method are now described in greater detail.

Figure 2:
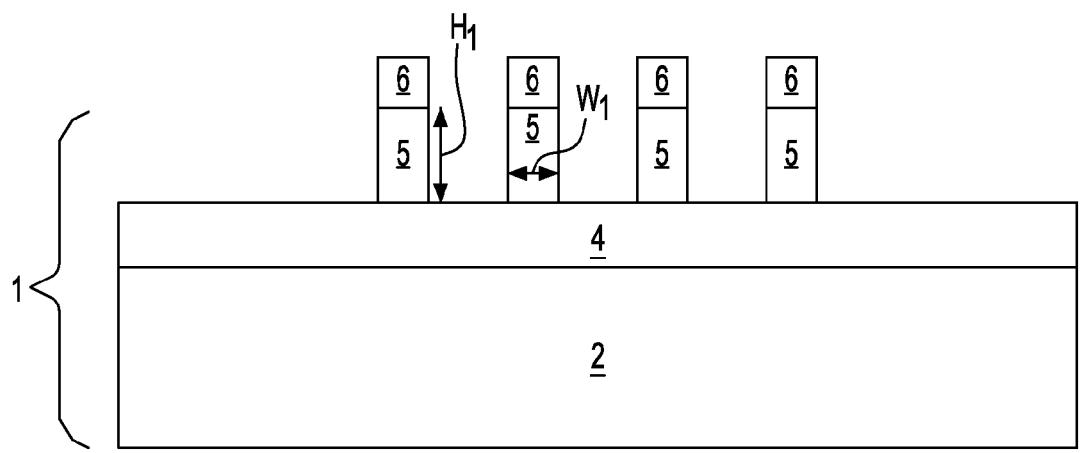
FIG. 2 is a side cross-sectional view across the fin structures depicted in FIG. 1 along section line a-a, in accordance with one embodiment of the present disclosure.

FIGS. 1 and 2 depict one embodiment of forming at least one fin structure 5 on a substrate surface 4. In the embodiment depicted in FIGS. 1 and 2, the substrate surface 4 that the at least one fin structure 5 is formed on is a dielectric surface that may be provided by the buried dielectric layer of a semiconductor on insulator (SOI) substrate. In some embodiments, the substrate surface 4 does not have to be a dielectric material. For example, in some embodiments that employ a bulk semiconductor substrate, the substrate surface 4 may be composed of a semiconductor material, such as silicon. Hereafter, the substrate surface 4 is referred to as a dielectric surface 4 in order to be consistent with the embodiments depicted in the supplied figures.

Specifically, FIG. 1 is a top down perspective view of four fin structures 5 (hereafter referred to as fin structures 5) that are present on a dielectric surface 4, in which section line a-a is across the fin structures 5, and section line b-b is through one of the fin structures 5. The term "across the fin structures" as used throughout the present disclosure corresponds to section line a-a in FIG. 1. The term "through the fin structures" as used throughout the present disclosure corresponds to section line b-b in FIG. 1. FIG. 2 is a side cross-sectional view across the at least one fin structure 5, i.e., across section line a-a depicted in FIG. 1, where fins are formed on a dielectric surface. These fins can be formed by patterning and etching of the semiconductor layer on a semiconductor-on-insulator (SOI) substrate. Alternatively, in the embodiments in which the fin structures are formed on a bulk semiconductor substrate (not shown in the supplied figures), adjacent fin structures can be isolated from each other by regions of dielectric material that is formed in between the fin structures.

Referring to FIG. 2, the fin structures 5 and the dielectric surface 4 that the fin structures 5 are present on may be formed from a semiconductor on insulator (SOI) substrate 1. The SOI substrate 1 may include a base semiconductor layer 2 and a top semiconductor layer (which is interchangeably referred to as an SOI layer) that are electrically isolated from each other by a buried dielectric layer. In one embodiment, the SOI substrate 1 may be patterned and etched to provide the initial structure depicted in FIG. 2, in which the SOI layer provides the fin structures 5 and the buried dielectric layer provides the dielectric surface 4.

The SOI layer and the base semiconductor layer 2 may comprise at least one of Si, Ge, SiGe, GaAs, InAs, InP, SiCGe, SiC as well as other III/V or II/VI compound semiconductors and alloys thereof. The SOI layer and base semiconductor layer 2 may comprise the same or different materials. In one example, the SOI layer is monocrystalline. The buried dielectric material separating the SOI layer and the base semiconductor layer 2 may be a crystalline or non-crystalline oxide, nitride, oxynitride, or any other suitable insulating material. The buried dielectric layer may comprise a single layer of dielectric material or multiple layers of dielectric materials. The buried dielectric layer may have a thickness ranging from 5 nm to 500 nm.

A photolithography and etch process sequence may be utilized to provide the fin structures 5 from the SOI substrate 1. Specifically and in one example, a photoresist mask is formed overlying the SOI layer of the SOI substrate 1 in which the portion of the SOI layer that is underlying the photoresist mask provides the semiconductor body 6, and the portion of the SOI layer that is not protected by the photoresist mask is removed using a selective etch process. To provide the photoresist mask, a photoresist layer is first positioned atop the SOI layer. The photoresist layer may be provided by a blanket layer of photoresist material that is formed utilizing for example, spin-on coating. The blanket layer of photoresist material is then patterned to provide the photoresist mask utilizing a lithographic process that may include exposing the photoresist material to a pattern of radiation and developing the exposed photoresist material utilizing a resist developer. Following the formation of the photoresist mask, an etching process may remove the unprotected portions of the SOI layer selective to the underlying buried dielectric layer. For example, the transferring of the pattern provided by the photoresist into the SOI layer may include an anisotropic etch. An anisotropic etch process is a material removal process in which the etch rate in the direction normal to the surface to be etched is greater than in the direction parallel to the surface to be etched. The anisotropic etch may include reactive-ion etching (RIE). Other examples of anisotropic etching that can be used at this point of the present invention include ion beam etching, plasma etching or laser ablation.

In one embodiment, a hard mask dielectric layer may be deposited over the SOI layer prior to the formation of the photoresist mask. The hard mask dielectric layer may be composed of a nitride or oxide, and may be referred to as a fin dielectric cap 6. The hard mask dielectric layer and a two stage anisotropic etch may be utilized to transfer the pattern from the photoresist mask into the SOI layer to provide the fin structures 5. More specifically, following the formation of the photoresist mask, the two stage anisotropic etch may be conducted, in which a first selective etch removes the exposed portions of the hard mask dielectric layer, wherein the photoresist mask protects the portion of the hard mask dielectric layer that is present beneath the photoresist mask to provide the dielectric fin cap 6 for each of the fin structures 5. The SOI layer that is beneath the protected remaining portions of the hard mask dielectric layer provides the fin structures 5 of the subsequently formed device. The first stage of the anisotropic etch may continue until the portion of the hard mask dielectric layer exposed by the photoresist mask is removed to expose the SOI layer. In a second stage of the two stage anisotropic etch, the exposed portions of the SOI layer are removed by an etch chemistry that removes the material of the SOI layer selective to the buried insulating layer, i.e., dielectric surface 4. During the second stage of the etch process, the remaining portion of the hard mask dielectric layer functions as an etch mask that protects the underlying portion of the SOI layer to provide the fin structures 5 from the SOI layer. During the second stage of the anisotropic etching, the exposed portion of the SOI layer is removed. In one example, each of the fin structures 5 is composed of silicon (Si), and the dielectric fin cap 6 that is atop each of the fin structures 5 is composed of silicon nitride or silicon oxide.

Each of the fin structures 5 may have a height $H_1$ ranging from 5 nm to 200 nm. In one embodiment, each of the fin structures 5 may have height $H_1$ ranging from 10 nm to 100 nm. In another embodiment, the each of the fin structures 5 may have a height $H_1$ ranging from 15 nm to 50 nm. Each of the fin structures 5 may have a width $W_1$ ranging from 5 nm to 50 nm. In another embodiment, each of the fin structures 5 may have width $W_1$ ranging from 8 nm to 20 nm. Adjacent fin structures 5 may be separated by a pitch P1 ranging from 20 nm to 100 nm. In one embodiment, adjacent fin structures 5 may be separated by a pitch P1 ranging from 30 nm to 50 nm.

It is noted that although the initial structure depicted in FIG. 2 is described as being formed from an SOI substrate, embodiments of the present disclosure are contemplated that utilize a bulk semiconductor substrate. It is also noted that although FIG. 2 depicts four fin structures 5, the present disclosure is not limited to only this embodiment, as any number of fin structures 5 may be present on the dielectric surface 4.

Figure 3A:
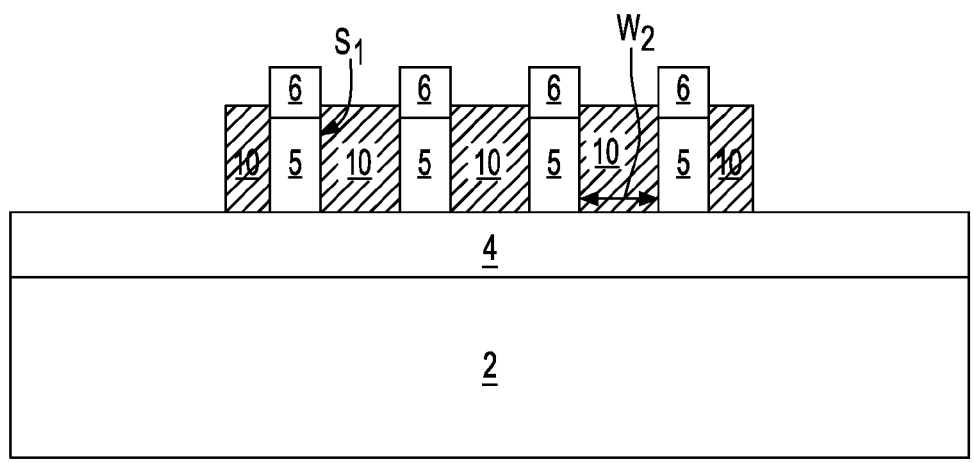
FIG. 3A is a side cross-sectional view across the fin structures depicted in FIG. 2 depicting forming an epitaxial semiconductor material on the sidewalls of the fin structures that are present on the substrate surface, wherein the fin structures have a first composition that is different from a second composition of the epitaxial semiconductor material, in accordance with one embodiment of the present disclosure.

FIG. 3A depicts one embodiment of forming an epitaxial semiconductor material 10 on the sidewalls S1 of each of the fin structures 5. FIG. 3A is a side cross-sectional view across the fin structures 5. A semiconductor material that is referred to as being "epitaxial" is a semiconductor material that is formed using epitaxial growth and/or deposition. The terms "epitaxial growth and/or deposition" and "epitaxially formed and/or grown" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gasses are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on semiconductor surface, and do not deposit material on dielectric surfaces, such as silicon oxide or silicon nitride surfaces.

The fin structures 5 are typically composed of a semiconductor material having a first composition that is different from a second composition of the epitaxial semiconductor material 10. The second composition of the epitaxial semiconductor material 10 is typically selected to allow for selective etching between the fin structures 5 and the epitaxial semiconductor material 10. As used herein, the term "selective" in reference to a material removal process denotes that the rate of material removal for a first material is greater than the rate of removal for at least another material of the structure to which the material removal process is being applied. For example, in one embodiment, a selective etch may include an etch chemistry that removes a first material selectively to a second material by a ratio of 10:1 or greater. In one embodiment, when the second composition of the epitaxial semiconductor material 10 is a germanium containing semiconductor, the first composition of the fin structures 5 is a silicon containing semiconductor that does not include germanium. For example, the germanium containing semiconductor that provides the epitaxial semiconductor material 10 may be silicon germanium (SiGe) or germanium (Ge) and the silicon containing semiconductor that provides the fin structures is silicon (Si). In one embodiment, the epitaxial semiconductor material 10 extends from the sidewall S1 of one fin structure 5 to the sidewall S1 of an adjacent fin structure 5, and may be referred to as a merging epitaxial semiconductor material.

In one embodiment, the epitaxial semiconductor material 10 may be composed of germanium (Ge). A number of different sources may be used for the deposition of epitaxial germanium. In some embodiments, the germanium containing gas sources for epitaxial growth include germane ($GeH_4$), digermane ($Ge_2H_6$), halogermane, dichlorogermane, trichlorogermane, tetrachlorogermane and combinations thereof.

In yet another embodiment, the epitaxial semiconductor material 10 is composed of a germanium-containing material, such as silicon germanium (SiGe). A number of different sources may be used for the deposition of epitaxial silicon germanium. In some embodiments, the gas source for the deposition of epitaxial SiGe may include a mixture of silicon containing gas sources and germanium containing gas sources. For example, an epitaxial layer of silicon germanium may be deposited from the combination of a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof, and a germanium gas source that is selected from the group consisting of germane, digermane, halogermane, dichlorogermane, trichlorogermane, tetrachlorogermane and combinations thereof. The germanium content of the epitaxial layer of silicon germanium may range from 5% to 90%, by atomic weight %. In another embodiment, the germanium content of the epitaxial layer of silicon germanium may range from 10% to 40%.

The temperature for epitaxial deposition process for forming the epitaxial semiconductor material 10 typically ranges from 550° C. to 900° C. Although higher temperature typically results in faster deposition, the faster deposition may result in crystal defects and film cracking.

In some embodiments, the epitaxial semiconductor material 10 provides the source and drain regions of the subsequently formed semiconductor device. As used herein, the term "source" is a doped region in the semiconductor device, in which majority carriers are flowing into the channel. As used herein, the term "drain" means a doped region in semiconductor device located at the end of the channel, in which carriers are flowing out of the transistor through the drain. The conductivity of the source and drain regions typically dictates the conductivity type of the semiconductor device. In some embodiments, the epitaxial semiconductor material 10 may be doped with an n-type or p-type dopant using an in-situ doping method. By "in-situ" it is meant that the dopant that dictates the conductivity type of the epitaxial semiconductor material 10 is introduced during the process step, e.g., epitaxial deposition, that forms the epitaxial semiconductor material. As used herein, "p-type" refers to the addition of impurities to an intrinsic semiconductor that creates deficiencies of valence electrons. In a type IV semiconductor (element of Group IV of the periodic table of elements), such as silicon, germanium or silicon germanium, examples of p-type dopants, i.e., impurities, include but are not limited to: boron, aluminum, gallium and indium. As used herein, "n-type" refers to the addition of impurities that contributes free electrons to an intrinsic semiconductor. In a type IV semiconductor, such as silicon, germanium or silicon germanium, examples of n-type dopants, i.e., impurities, include but are not limited to antimony, arsenic and phosphorous. Alternatively, the dopant that provides the conductivity type of the epitaxial semiconductor material 10 is introduced by ion implantation during a later stage of method of forming the semiconductor device.

In one embodiment, the epitaxial semiconductor material 10 has a width W2 ranging from 10 nm to 100 nm. In another embodiment, the width W2 of the epitaxial semiconductor material 10 ranges from 20 nm to 40 nm. In some embodiments, the width W2 of the epitaxial semiconductor material 10 is selected so that the epitaxial semiconductor material 10 extends from the sidewall of a first fin structure 5 to the sidewall of an adjacent fin structure 5.

Figure 3B:
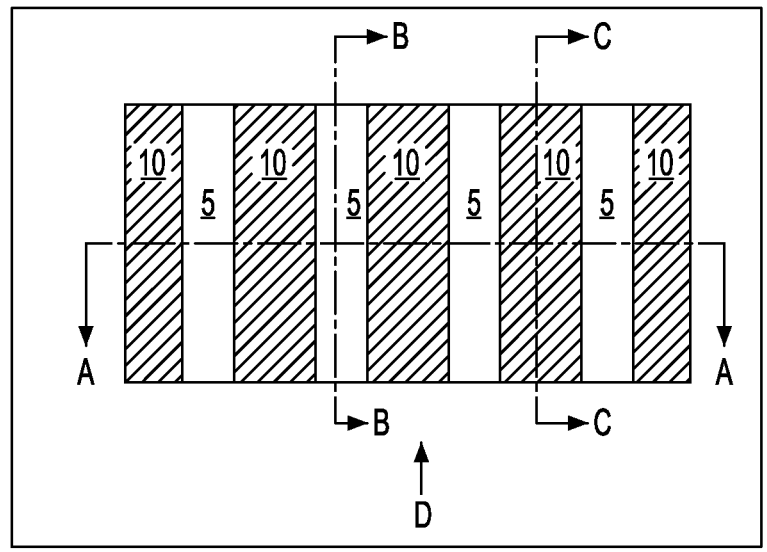
FIG. 3B is a top down view of the fin structures depicted in FIG. 3A, wherein the epitaxial semiconductor material is present between adjacent fin structures.

FIG. 3B is a top down view of the fin structures 5 depicted in FIG. 3A, in which section line c-c is through the epitaxial semiconductor material 10 and the arrow extending from point "d" indicates the perspective of a side view of the fin structures 5. The term "through the epitaxial semiconductor material" as used throughout the present disclosure is intended to correspond to section line c-c in FIG. 3B. The term "side view of the fin structures" as used throughout the present disclosure is intended to correspond to a perspective view of the fin structures from point "d" in the direction indicated by the arrow.

Figure 4A:
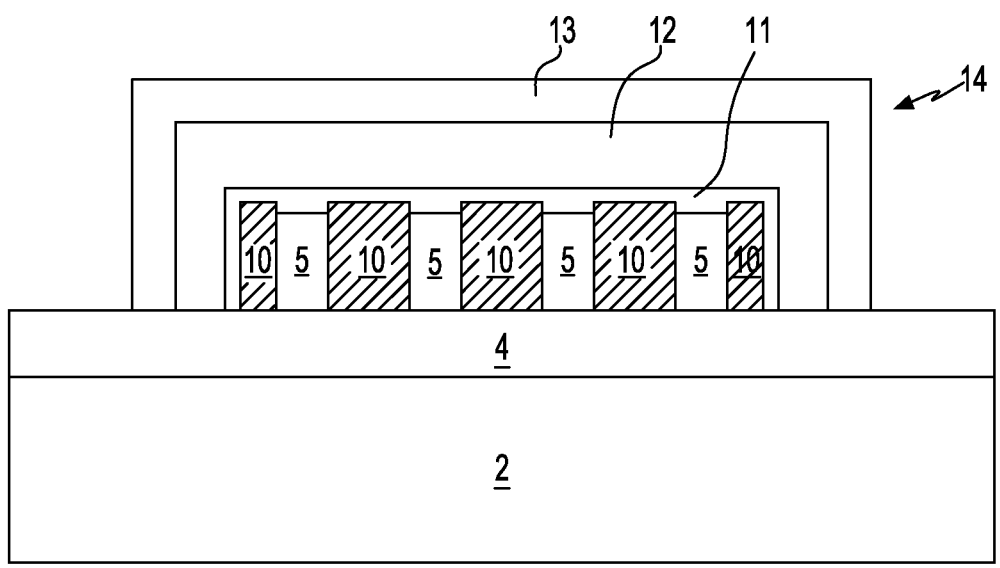
FIG. 4A is a side cross-sectional view across the fin structure (along section line a-a depicted in FIG. 3B) depicting forming a replacement gate stack on the fin structures depicted in FIG. 3A, in accordance with one embodiment of the present disclosure.

FIG. 4A is a side cross-sectional view across the fin structures 5 depicting removing the dielectric fin cap 6 and forming a replacement gate stack 14 on the fin structures 5. The dielectric fin cap 6 may be removed by a selective etch process. In one embodiment, the dielectric fin cap 6 is removed by an etch that is selective to the fin structures 5, the epitaxial semiconductor material 10 and the dielectric surface 4. The etch process for removing the dielectric fin cap 6 may be an anisotropic, such as reactive ion etch (RIE), or an isotropic etch, such as a wet chemical etch. In one embodiment, after removing the dielectric fin cap 6, the upper surface of the fin structures 5 is vertically offset from the upper surface of the epitaxial semiconductor material 10 by a dimension ranging from 0 nm to 20 nm. In another embodiment, the upper surface of the fin structures 5 is vertically offset from the upper surface of the epitaxial semiconductor material 10 by a dimension ranging from 2 nm to 10 nm. In yet another embodiment, the upper surface of the fin structures 5 is vertically offset from the upper surface of the epitaxial semiconductor material 10 by a dimension ranging from 3 nm to 5 nm. In some embodiments, the dielectric fin cap 6 is removed to provide a tri-gate semiconductor device, and in some embodiments the dielectric fin cap 6 is not removed and remains the in final device structure to provide a finFET semiconductor device.

Referring to FIG. 4A, in one embodiment, the replacement gate stack 14 may include a sacrificial gate dielectric layer 11, a sacrificial gate conductor layer 12 and a sacrificial gate dielectric cap 13. The sacrificial gate dielectric layer 11 may be composed of any dielectric material, such as an oxide, nitride, or oxynitride material. In one embodiment, the composition of the sacrificial gate dielectric layer 11 is selected so that the sacrificial dielectric is removed by an etch that is selective to the underlying fin structures 5. The sacrificial gate dielectric layer 11 may be formed using a deposition process, such as chemical vapor deposition (CVD). The sacrificial gate dielectric layer 11 may also be deposited using evaporation, chemical solution deposition, spin on deposition, and physical vapor deposition (PVD) methods, or may be formed using thermal growth methods. The sacrificial gate conductor layer 12 may be composed of a semiconductor-containing material, such as a silicon-containing material, e.g., polycrystalline silicon, single crystal silicon, polycrystalline silicon and silicon germanium. The sacrificial gate conductor layer 12 may be formed using a deposition process, such as CVD, evaporation, chemical solution deposition, spin on deposition, and PVD methods. The sacrificial gate dielectric cap 13 may be composed of an oxide, nitride or oxynitride, and may be formed using chemical vapor deposition (CVD), physical vapor deposition (PVD), thermal growth methods, or a combination thereof.

Figure 4B:
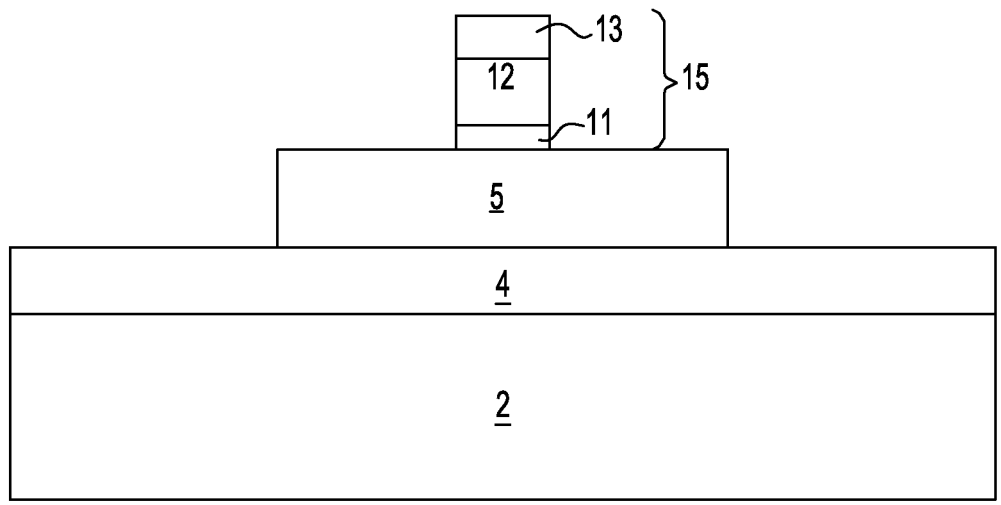
FIG. 4B is a side cross-sectional view through the one of the fin structures (along section line b-b depicted in FIG. 3B) depicting patterning the replacement gate stack depicted in FIG. 4A to form a replacement gate structure, in accordance with one embodiment of the present disclosure.
Figure 4C:
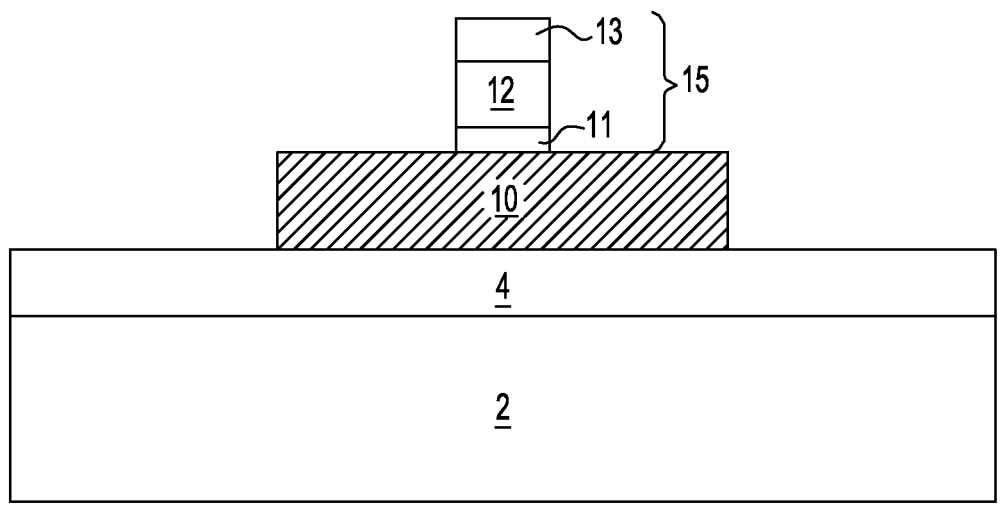
FIG. 4C is a side cross-sectional view through the epitaxial semiconductor material (along section line c-c depicted in FIG. 3B) of the structure depicted in FIG. 4A, in accordance with one embodiment of the present disclosure.

FIGS. 4B-4C depict one embodiment of patterning the replacement gate stack 14 to provide a replacement gate structure 15 on the channel portion of the fin structures 5. FIG. 4B is a side cross-sectional view through the fin structure, and FIG. 4C is a side cross-sectional view through the epitaxial semiconductor material. The replacement gate structure 15 includes sacrificial material that defines the geometry of a later formed functional gate structure that functions to switch the semiconductor device from an "on" to "off" state, and vice versa.

In one embodiment, the replacement gate stack 14 depicted in FIG. 4A may be patterned and etched to provide the replacement gate structure 15 depicted in FIGS. 4B and 4C using photolithography and etch processes. In one embodiment, a pattern is produced by applying a photoresist to the surface to be etched, exposing the photoresist to a pattern of radiation, and then developing the pattern into the photoresist utilizing a resist developer. Once the patterning of the photoresist is completed, the sections covered by the photoresist are protected, while the exposed regions are removed using a selective etching process that removes the unprotected regions. In one embodiment, the etch process removes the exposed portions of the replacement gate stack 14 with an etch chemistry that is selective to the fin structures 5 and the epitaxial semiconductor material 10. In one embodiment, the etch process that forms the replacement gate structure 15 is an anisotropic etch. The anisotropic etch may include reactive-ion etching (RIE). Other examples of anisotropic etching that can be used include ion beam etching, plasma etching or laser ablation. The remaining portion of the replacement gate stack that provides the replacement gate structure 15 is present on a channel portion of the fin structures 5.

Figure 5A:
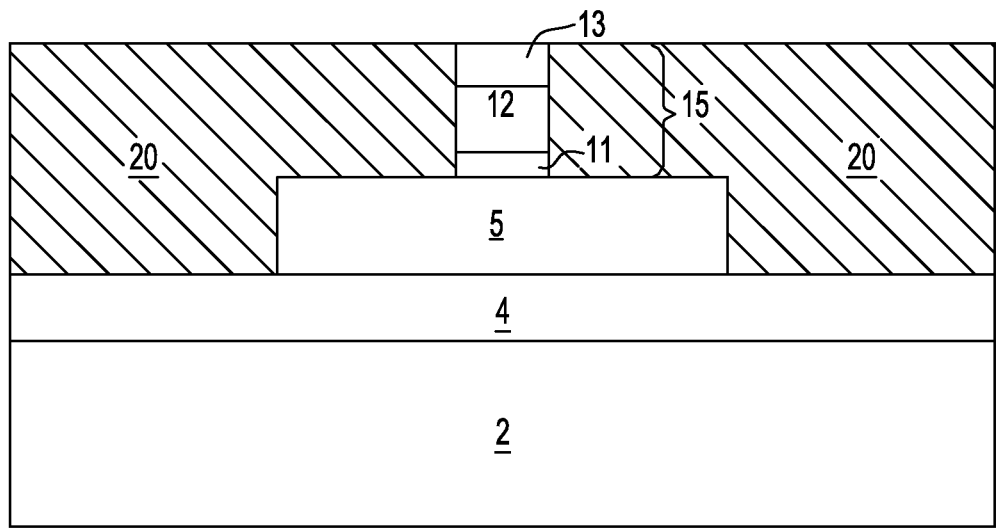
FIG. 5A is a side cross-sectional view through one of the fin structures (along section line b-b depicted in FIG. 3B) depicting forming an interlevel dielectric on the structure depicted in FIG. 4B, in accordance with one embodiment of the present disclosure.
Figure 5B:
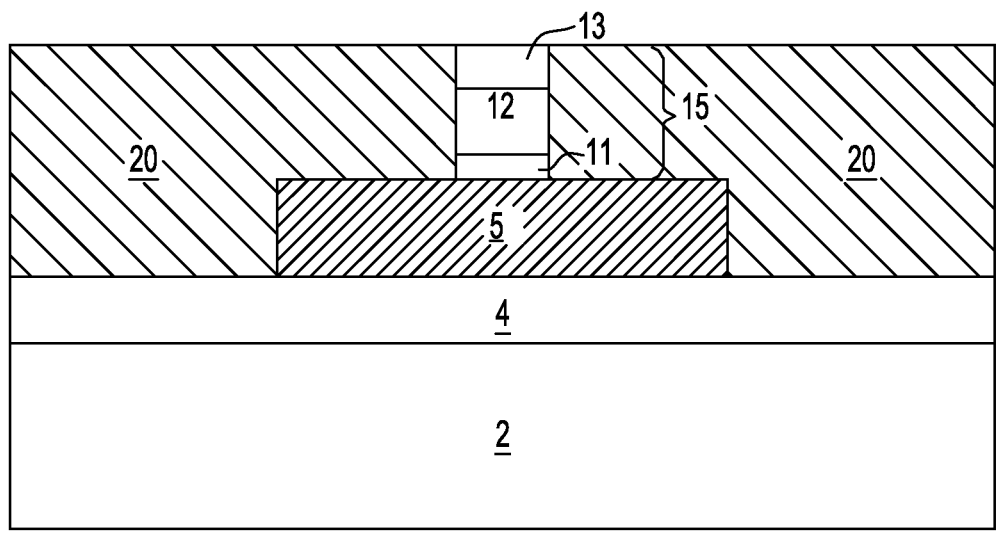
FIG. 5B is a side cross-sectional view through the epitaxial semiconductor material (along section line c-c depicted in FIG. 3B) depicting forming an interlevel dielectric on the structure depicted in FIG. 4C, in accordance with one embodiment of the present disclosure.

FIGS. 5A and 5B depict one embodiment of forming an interlevel dielectric 20 on the replacement gate structure 15, the epitaxial semiconductor material 10 and the fin structures 5, and planarizing the interlevel dielectric 20 so that an upper surface of the interlevel dielectric 20 is coplanar with an upper surface of the replacement gate structure 15. The interlevel dielectric 20 may be selected from the group consisting of silicon-containing materials such as $SiO_2$, $Si_3N_4$, $SiO_xN_y$, SiC, SiCO, SiCOH, and SiCH compounds; the above-mentioned silicon-containing materials with some or all of the Si replaced by Ge; carbon-doped oxides; inorganic oxides; inorganic polymers; hybrid polymers; organic polymers such as polyamides or SiLK™; other carbon-containing materials; organo-inorganic materials such as spin-on glasses and silsesquioxane-based materials; and diamond-like carbon (DLC), amorphous hydrogenated carbon ($\alpha$-C:H), or silicon boron nitride (SiBN). The interlevel dielectric layer 20 may be deposited using at least one of spinning from solution, spraying from solution, chemical vapor deposition (CVD), plasma enhanced CVD (PECVD), atomic layer deposition (ALD), sputter deposition, reactive sputter deposition, ion-beam deposition, and evaporation. Following deposition of the dielectric material for the interlevel dielectric layer 20, a planarization processes is conducted to provide a planar upper surface, wherein the upper surface of the interlevel dielectric layer 20 is coplanar with the upper surface of the replacement gate structure 25. The planarization of the interlevel dielectric layer 20 may be provided by chemical mechanical planarization (CMP).

Figure 6A:
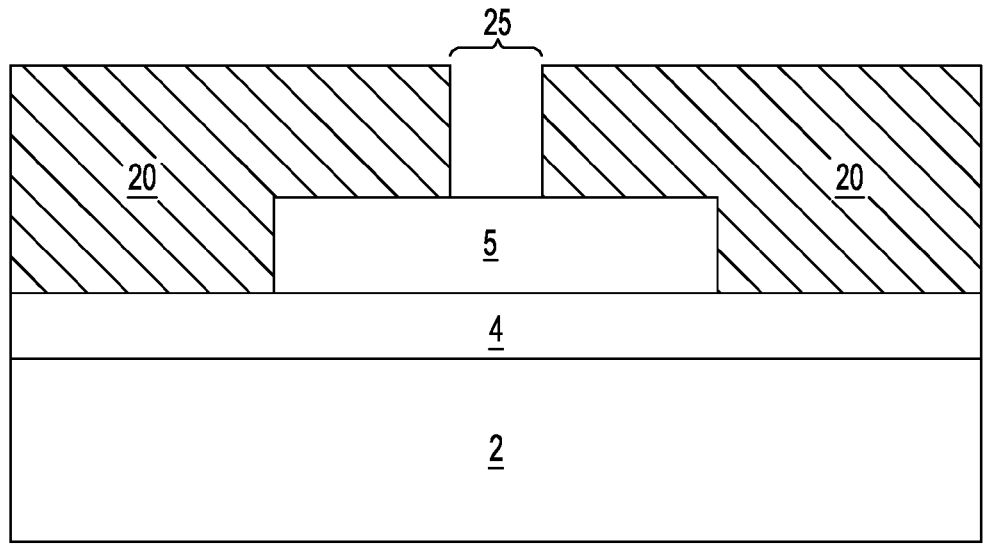
FIG. 6A is a side cross-sectional view through one of the fin structures (along section line b-b depicted in FIG. 3B) depicting removing the replacement gate structure from the structure depicted in FIG. 5A to provide a first opening, in accordance with one embodiment of the present disclosure.
Figure 6B:
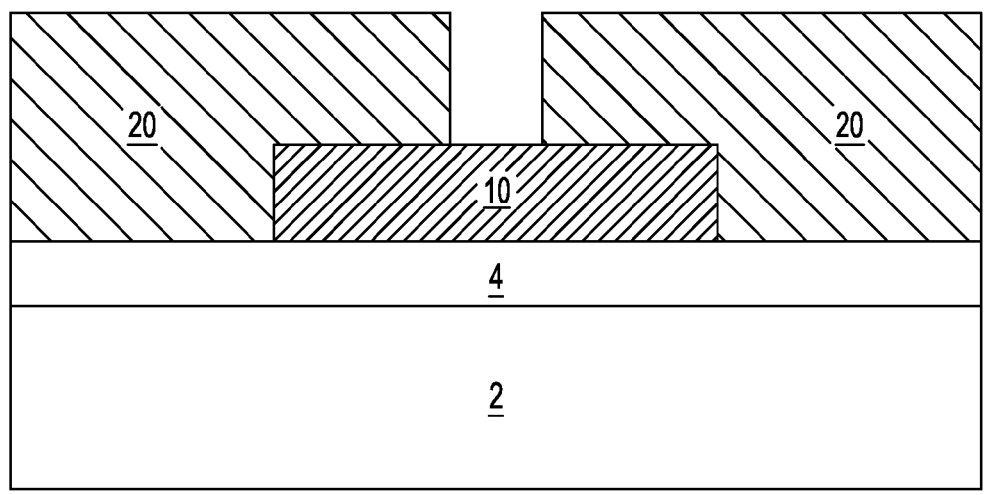
FIG. 6B is a side cross-sectional view through the epitaxial semiconductor material (along section line c-c depicted in FIG. 3B) depicting removing the replacement gate structure from the structure depicted in FIG. 5B, in accordance with one embodiment of the present disclosure.

FIGS. 6A and 6B depict one embodiment of removing the replacement gate structure 15 to provide a first opening 25 to the fin structures 5. FIG. 6A is a side cross-sectional view through a fin structure 5, and FIG. 6B is a side cross-sectional view through an epitaxial semiconductor material 10. In one embodiment, the replacement gate structure 15 may be removed with an etch process. The etch process for removing the replacement gate structure 15 may be a selective etch. The replacement gate structure 15 may be removed using a wet or dry etch process. In one embodiment, the replacement gate structure 15 is removed by reactive ion etch (RIE). In one example, an etch step for removing the replacement gate structure 15 can include an etch chemistry for removing the replacement gate structure 15 selective to the fin structures 5, the epitaxial semiconductor material 10, and the interlevel dielectric layer 20.

Figure 7:
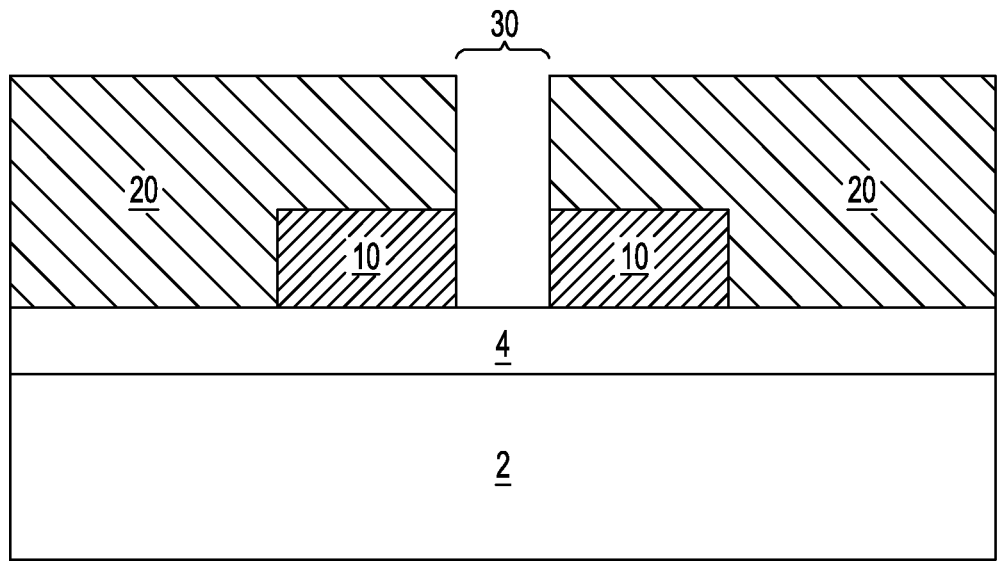
FIG. 7 is a side cross-sectional view through the epitaxial semiconductor material (along section line c-c depicted in FIG. 3B) depicting removing an exposed portion of the epitaxial semiconductor material from the structure depicted in FIG. 6B with an anisotropic etch to provide a second opening that terminates on the dielectric surface, in accordance with one embodiment of the present disclosure.

FIG. 7 is a side cross-sectional view through a epitaxial semiconductor material 10 depicting removing an exposed portion of the epitaxial semiconductor material 10 from the structure depicted in FIG. 6B with an anisotropic etch to provide a second opening 30 that terminates on the dielectric surface 4. The anisotropic etch for removing the exposed portion of the epitaxial semiconductor material 10 may be reactive ion etch (RIE). Other anisotropic etch processes that are suitable for removing the exposed portion of the epitaxial semiconductor material 10 include ion beam etching, plasma etching or laser ablation. In one embodiment, the etch process for removing the epitaxial semiconductor material 10 removes the material of the epitaxial semiconductor material 10 selectively to the interlevel dielectric layer 20 and fin structures 5, wherein the etch process terminates on the dielectric surface 4.

Figure 8A:
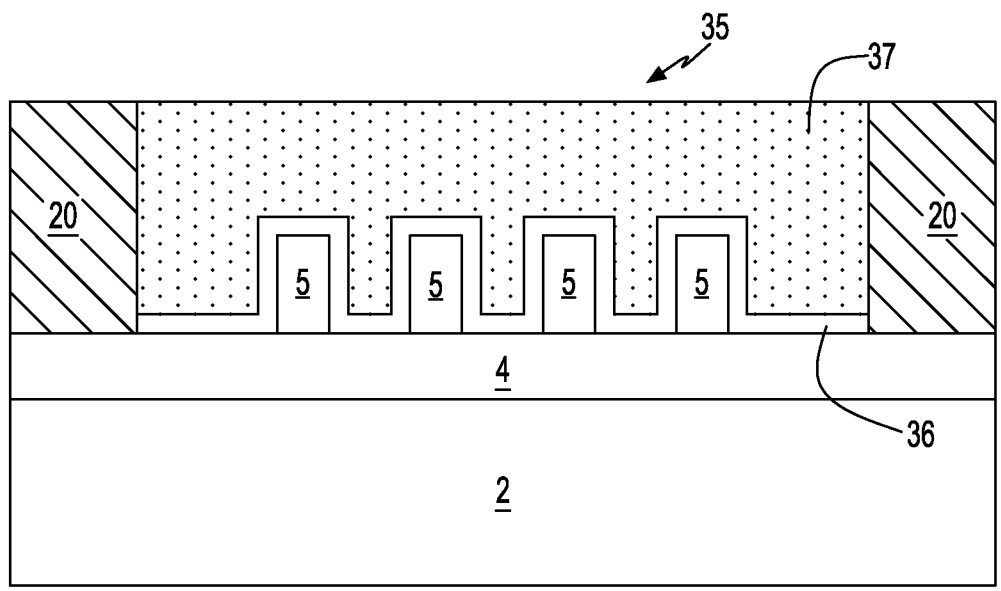
FIG. 8A is a side cross-sectional view across the fin structures (along section line a-a depicted in FIG. 3B) depicting forming a functional gate structure in the first opening and the second opening to the fin structures, in accordance with one embodiment of the present disclosure.
Figure 8B:
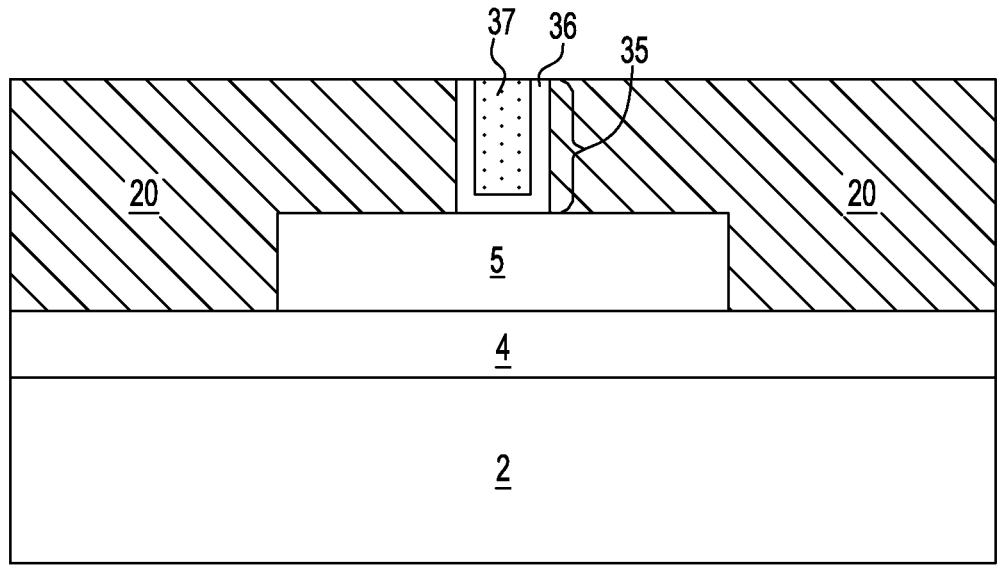
FIG. 8B is a side cross-sectional view through one of the fin structures (along section line b-b depicted in FIG. 3B) of the structure depicted in FIG. 8A, in accordance with one embodiment of the present disclosure.
Figure 8C:
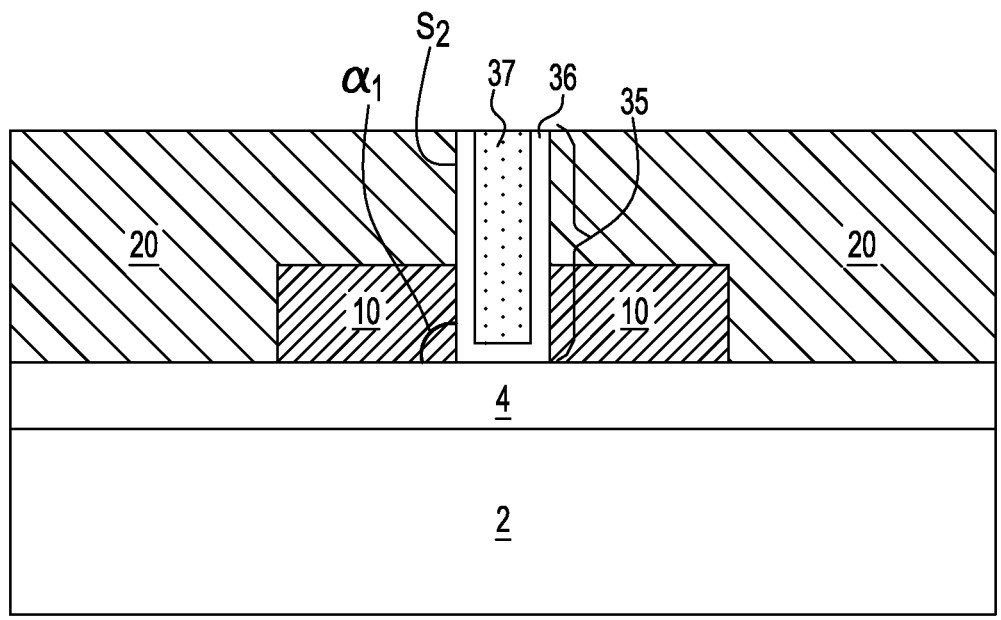
FIG. 8C is a side cross-sectional view through the epitaxial semiconductor material (along section line c-c depicted in FIG. 3B) of the structure depicted in FIG. 8A, in accordance with one embodiment of the present disclosure.

FIGS. 8A-8C depict one embodiment of forming a functional gate structure in the first opening and the second opening to the fin structures 5. FIG. 8A is a side cross-sectional view across the fin structures 5, FIG. 8B is a side cross-sectional view through the at least one fin structure 5, and FIG. 8C is a side cross-sectional view through the epitaxial semiconductor material 10. The functional gate structure 35 includes at least one gate dielectric 36 and at least one gate conductor 37. The at least one gate dielectric 36 of the functional gate structure 35 may be composed of any dielectric material including oxides, nitrides and oxynitrides. In one embodiment, the at least one gate dielectric 36 may be provided by a high-k dielectric material. The term "high-k" is used to describe the material of the at least one gate dielectric 36 denotes a dielectric material having a dielectric constant greater than silicon oxide ($SiO_2$) at room temperature (20° C. to 25° C.) and atmospheric pressure (1 atm). For example, a high-k dielectric material may have a dielectric constant greater than 4.0. In another example, the high-k gate dielectric material has a dielectric constant greater than 7.0. In an even further example, the dielectric constant of the high-k dielectric material may be greater than 10.0. In one embodiment, the at least one gate dielectric 36 is composed of a high-k oxide such as, for example, $HfO_2$, $ZrO_2$, $Al_2O_3$, $TiO_2$, $La_2O_3$, $SrTiO_3$, $LaAlO_3$, $Y_2O_3$ and mixtures thereof. Other examples of high-k dielectric materials for the at least one gate dielectric 36 include hafnium silicate, hafnium silicon oxynitride or combinations thereof. In one embodiment, the at least one gate dielectric 36 may be deposited by chemical vapor deposition (CVD). Variations of CVD processes suitable for depositing the at least one gate dielectric 36 include, but are not limited to, APCVD, LPCVD, PECVD, MOCVD, ALD, and combinations thereof.

In one embodiment, the at least one gate dielectric 36 may be deposited using a conformal deposition method. The term "conformal layer" denotes a layer having a thickness that does not deviate from greater than or less than 20% of an average value for the thickness of the layer. The at least one gate dielectric 36 may be deposited on the channel portion of the fin structures 5. The at least one gate dielectric 36 is also formed on the sidewalls of the first opening and the sidewalls of the second opening that are define by the interlevel dielectric 20. In one embodiment, the thickness of the at least one gate dielectric 36 is greater than 0.8 nm. More typically, the at least one gate dielectric 36 has a thickness ranging from about 1.0 nm to about 6.0 nm.

The at least one gate conductor 37 is formed on the at least one gate dielectric 36. The at least one gate conductor 37 may be formed by a deposition process, such as CVD, plasma-assisted CVD, plating, and/or sputtering, followed by planarization. In one embodiment, the at least one gate conductor 37 is composed of metal or a doped semiconductor. Examples of metals that may be employed for the at least one gate conductor 37 may include, but is not limited to, W, Ni, Ti, Mo, Ta, Cu, Pt, Ag, Au, Ru, Ir, Rh, and Re, Al, TiN, WN, TaN, TiAlN, TaAlN, and alloys thereof. One example of a doped semiconductor that is suitable for the at least one gate conductor 37 is doped polysilicon.

Referring to FIG. 8C, in one embodiment, the sidewall S2 of the functional gate structure 35 is substantially perpendicular to the upper surface of the dielectric surface 4, wherein the plane defined by the sidewall S2 of the functional gate structure 35 and a plane defined by an upper surface of the dielectric surface 4 intersect at an angle α1 of 90°+/−10°. In another embodiment, the plane defined by the sidewall S2 of the functional gate structure 35 and a plane defined by an upper surface of the dielectric surface 4 intersect at an angle α2 of 90°+/−5°. In yet another embodiment, the plane defined by the sidewall S2 of the functional gate structure 35 and a plane defined by an upper surface of the dielectric surface 4 intersect at an angle α2 of 90°.

In some embodiments, in which the epitaxial semiconductor material 10 has not been doped prior to forming the functional gate structure 35 to provide the source and drain regions of the semiconductor device, at least a portion of the interlevel dielectric layer 20 may be removed to expose a remaining portion of the epitaxial semiconductor material 10. Once the remaining portion of the epitaxial semiconductor material 10 has been exposed, an n-type or p-type dopant may be implanted into the epitaxial semiconductor material using ion implantation to provide the source and drain regions of the semiconductor device.

In some embodiments, in the method described with reference to FIGS. 1-8C, in which the dielectric fin caps 6 are removed from the fin structures 5, the at least one functional gate dielectric 36 is in direct contact with a sidewall and an upper surface for each of the fin structures 5, and the semiconductor device that is formed by the method is a tri-gate semiconductor device. In other embodiments, in the method described with reference to FIGS. 1-8C, in which the dielectric fin caps 6 are not removed from the upper surface of the fin structures 5, the functional gate dielectric 36 is in direct contact with a sidewall for each of the fin structures 5 and is separated from an upper surface for each of the fin structures 5 by the dielectric fin caps 6, and the semiconductor device is a finFET semiconductor device.

In another embodiment of the present disclosure, a low-k spacer is formed adjacent to the high-k gate dielectric of the functional gate structure. The term "low" is used to describe the spacer that is adjacent to the gate dielectric of the functional gate structure denotes that the spacer has a lower dielectric constant than the gate dielectric. In some embodiments, the low-k spacer reduces the parasitic capacitance of the semiconductor device. One process sequence for forming the low-k spacer is depicted in FIGS. 1-6B in combination with FIGS. 9 and 10. In one embodiment, the method may begin with forming an epitaxial semiconductor material 10 on the sidewalls S1 of the fin structures 5 that are present on the dielectric surface 4, as depicted in FIG. 3A. As described above with reference to FIG. 3A, the fin structures 5 may have a first composition that is different from a second composition of the epitaxial semiconductor material 10. A replacement gate structure 15 may then be formed on a channel portion of the fin structures 5, as depicted in FIGS. 4A-4C. An interlevel dielectric layer 20 is then formed over an exposed portion of the fin structures 5, wherein the interlevel dielectric layer 20 has an upper surface that is coplanar with an upper surface of the replacement gate structure 15, as depicted in FIGS. 5A and 5B. The replacement gate structure 15 is then removed with an etch that is selective to the at least one fin structure 5 and the epitaxial semiconductor material 10, wherein removing the replacement gate structure 15 provides a first opening 25 to the fin structures 5, as depicted in FIG. 6A. An exposed portion of the epitaxial semiconductor material 10 is removed with an anisotropic etch to provide a second opening 30 that terminates on the dielectric surface 4, as depicted in FIG. 6B.

The above summation of the process steps depicted in FIGS. 1-6B is not intended to limit this embodiment to only the above description, because the entire process sequence of the previously described embodiments with reference to FIGS. 1-6B is applicable to the present embodiment. For example, each of the fin structures 5 that are employed in the method depicted in FIGS. 1-6B, 9 and 10 may include a dielectric fin cap 6 (as depicted in FIG. 2) that is removed after forming the sacrificial semiconductor material 10 (as depicted in FIG. 3A) and before forming the replacement gate structure 15 (as depicted in FIGS. 4A-4C).

Figure 9:
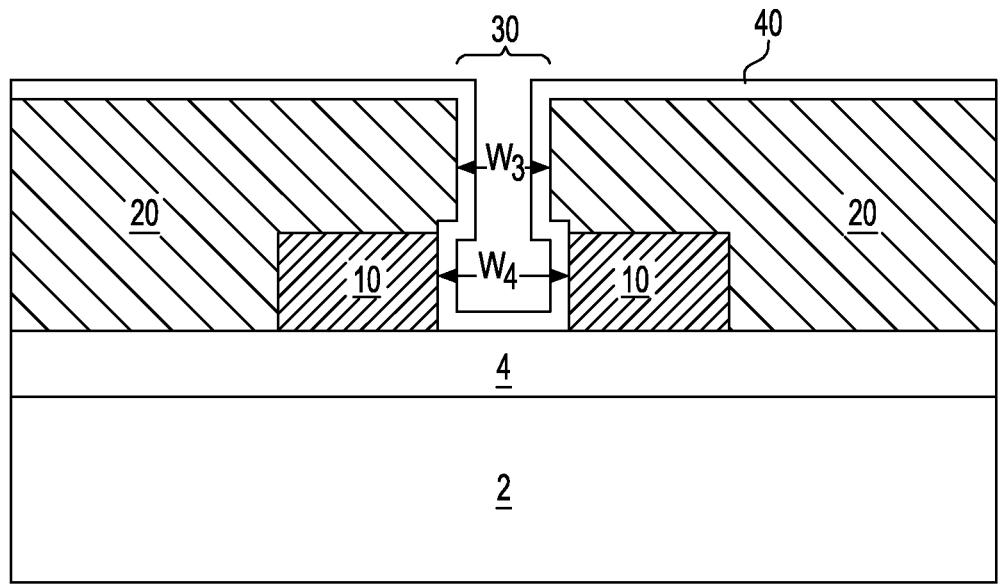
FIG. 9 is a side cross-sectional view through the epitaxial semiconductor material (along section line c-c depicted in FIG. 3B) depicting an isotropic etch applied to the second opening depicted in FIG. 7, wherein the isotropic etch increases a width of the second opening, and depositing a conformal dielectric layer having a first dielectric constant within the second opening, in accordance with another embodiment of the present disclosure.

Referring to FIG. 9, an isotropic etch is applied to the second opening 30 that is depicted in FIG. 6B to increase the width of the second opening 30. Contrary to anisotropic etch processes, isotropic etching is non-directional. The first width W3 is the width of the second opening before the isotropic etch process. The first width W3 is equal to the desired gate length and can range anywhere between 5 nm to a few microns, e.g., 1 micron, 2 microns, 3 microns, etc. The second width W4 is the width of the second opening 30 after the isotropic etch process. In one embodiment, the second width W4 is greater than the first width W3 by a dimension ranging from 2 nm to 10 nm. In another embodiment, the second width W4 is greater than the first width W3 by a dimension ranging from 4 nm to 8 nm.

In one embodiment, the isotropic etch process removes the epitaxial semiconductor material 10 selectively to the interlevel dielectric layer 20 and the fin structures 5. By etching the epitaxial semiconductor material 10 selectively to the interlevel dielectric layer 20 and fin structures 5, an undercut region is formed underlying the interlevel dielectric layer 20. In one embodiment, where the epitaxial semiconductor 10 is composed of SiGe and the fin structures 5 is composed of Si, the isotropic etch for increasing the width of the second opening may include wet etching using a mixture of hydrogen peroxide ($H_2O_2$), ammonium hydroxide ($NH_4OH$) and water, wet etching using hydrogen peroxide, or dry etching in HCl ambient.

Referring to FIG. 9, a conformal dielectric layer 40 having a first dielectric constant is applied to the second opening 30 following the isotropic etch. The dielectric constant of the conformal dielectric layer 40 is typically less than the subsequently formed functional gate dielectric layer to reduce the parasitic capacitance that is formed in the semiconductor device. For example, when the functional gate dielectric layer of the subsequently formed functional gate structure is a high-k gate dielectric, such as hafnium oxide ($HfO_2$), the conformal dielectric layer 40 may be composed of a lower-k dielectric, such as silicon oxide ($SiO_2$), silicon nitride (SiN), or silicon oxynitride.

In one embodiment, a low-k dielectric of the conformal dielectric layer 40 is a dielectric material having a dielectric constant ranging from 2 to 9, and a high-k dielectric of the subsequently formed functional gate dielectric is a dielectric material having a dielectric constant ranging from 10 to 40. In another embodiment, the low-k dielectric of the conformal dielectric layer 40 is a dielectric material having a dielectric constant that ranges from 3 to 7, and the high-k dielectric material of the subsequently formed functional gate dielectric has a dielectric constant that ranges from 10 to 25. The dielectric constants discussed herein are at room temperature, e.g., 20° C. to 25° C., and atmospheric pressure (1 atm).

The conformal dielectric layer 40 may be formed using a deposition process, such as chemical vapor deposition (CVD), e.g., plasma enhanced chemical vapor deposition (PECVD), or atomic layer deposition (ALD). The thickness of the conformal dielectric layer 40 may be selected to at least fill the undercut regions formed by the isotropic etch that increased the width of the second opening 30 to the second width W2. The portions of the conformal dielectric layer 40 that are present in the undercut regions are present in a lower portion of the second opening 30, and are in direct contact with the remaining portion of the epitaxial semiconductor material 10. The conformal dielectric layer 40 may also be deposited on the upper surface of the interlevel dielectric layer 20 and the sidewall surfaces of the interlevel dielectric layer 20 that provide the upper portion of the second opening 30, as well as the base of the second opening 30 that is provided by the dielectric surface 4. In one embodiment, the conformal dielectric layer 40 has a thickness ranging from 2 nm to 10 nm. In another embodiment, the conformal dielectric layer 40 has a thickness ranging from 2 nm to 5 nm.

Figure 10:
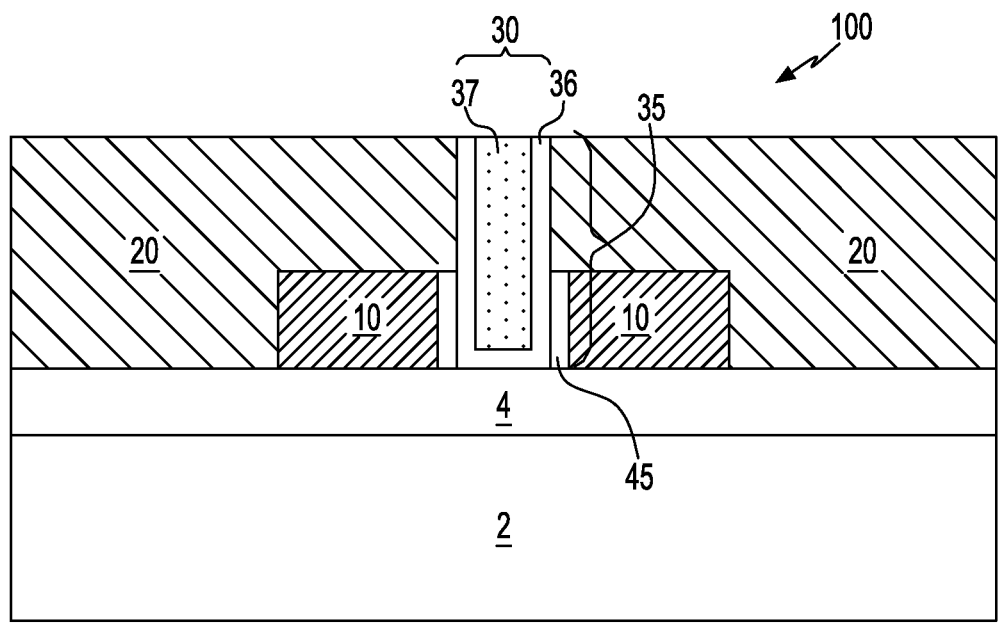
FIG. 10 is a side cross-sectional view through the epitaxial semiconductor material (along section line c-c depicted in FIG. 3B) depicting forming a functional gate structure filling at least a portion of the first opening and the second opening that are depicted in FIG. 9, wherein the functional gate structure includes a gate dielectric having a second dielectric constant that is greater than the first gate dielectric, in accordance with another embodiment of the present disclosure.

Referring to FIG. 10, in one embodiment, an anisotropic etch, such as reactive ion etch (RIE), may remove the portions of the conformal dielectric layer 40 that are present on the upper surface of the interlevel dielectric layer 20, the sidewall surfaces of the interlevel dielectric layer 20 that provide the upper portion of the second opening 30, and the base of the second opening 30 that is provided by the dielectric surface 4. In one embodiment, the anisotropic etch being applied to the conformal dielectric layer 40 is selective to the interlevel dielectric layer 20, the dielectric surface 4, and the fin structures 5. The remaining portion of the conformal dielectric layer 40 is present in the undercut regions, and provides the low-k spacer 45 that is present adjacent to the subsequently formed high-k functional gate dielectric of the functional gate structure. In some embodiments, because the conformal dielectric layer 40 is present in the undercut regions, and the etch process is an anisotropic etch, the portion of the conformal dielectric layer 40 that is present in the undercut regions is protected from being removed by the overhanging portion of the interlevel dielectric layer 20. In one embodiment, the low-k spacer 45 has a width ranging from 2 nm to 10 nm. In another embodiment, the low-k spacer 45 has a width ranging from 2 nm to 5 nm.

FIG. 10 further depicts forming a functional gate structure 35 filling at least a portion of the second opening 30 that is depicted in FIG. 9, as well as the second opening to the fin structures. FIG. 10 is a side cross-sectional view through the epitaxial semiconductor material 10. The functional gate structure 35 includes at least one functional gate dielectric 36 and at least one functional gate conductor 37. In some embodiments, the functional gate dielectric 36, e.g., high-k gate dielectric, has a dielectric constant that is greater than the dielectric constant of the low-k spacer 45. The functional gate structure 35 including the at least one functional gate conductor 37 and the at least one functional gate dielectric 36 that is depicted in FIG. 10 is similar to the functional gate structure 35 that is described above with reference to FIGS. 8A-8C. Therefore, the method of forming the functional gate structure 35 and the description of its components that is described above with reference to FIGS. 8A-8C, is suitable for the functional gate structure 35 that is depicted in FIG. 10, with the exception that in the structure depicted in FIG. 10, the functional gate structure 35 is in direct contact with the low-k spacer 45. In one embodiment, the low-k spacer 45 extends between the sidewalls of the adjacent fin structures 5 and separates the remaining portion of the epitaxial semiconductor material 10 from the functional gate structure 35. The low-k spacer 45 has an upper surface that is substantially coplanar with an upper surface of the fin structures 5. The term "substantially coplanar" as used to describe the upper surface of the fin structures 5 and the upper surface of the low-k spacer 45 is meant to denote that the vertical offset between the upper surface of the fin structures 5 and the upper surface of the low-k spacer 45 may be no greater than 5 nm.

In some embodiments, in the method described with reference to FIGS. 1-6B, 9 and 10, in which the dielectric fin caps 6 are removed from the fin structures 5, the at least one functional gate dielectric 36 is in direct contact with a sidewall and an upper surface for each of the fin structures 5, and the semiconductor device that is formed by the method is a tri-gate semiconductor device. In other embodiments, in the method described with reference to FIGS. 1-6B, 9 and 10, in which the dielectric fin caps 6 are not removed from the upper surface of the fin structures 5, the at least one functional gate dielectric 36 is in direct contact with a sidewall for each of the fin structures 5 and is separated from an upper surface for each of the fin structures 5 by the dielectric fin cap 6. In this embodiment, the semiconductor device is a finFET semiconductor device.

Another embodiment of the present disclosure is provided by a process sequence that is depicted by FIGS. 1-4C in combination with FIGS. 11-17B, in which a sacrificial semiconductor material 10 may be employed to overcome the difficulties of topography variations in the manufacture of semiconductor devices including fin structures. The variations in topography of fin structures can result in functional gate structures having a tapered sidewall. The methods and structures disclosed herein, which may employ the sacrificial semiconductor material 10 to reduce fin structure topography, can form functional gate structures having perpendicular sidewalls.

In one embodiment, a method of fabricating a semiconductor device is provided that may begin with epitaxially forming an epitaxial semiconductor material 10 (hereafter referred to as a sacrificial semiconductor material 10) on at least two fin structures 5, in which the sacrificial semiconductor material 10 at least extends from a first sidewall of a first fin structure 5 to a second sidewall an adjacent fin structure 5, as described above with reference to FIG. 3A. The sacrificial semiconductor material 10 may have a different composition than the fin structures 5. For example, the sacrificial semiconductor material 10 may be composed of a germanium containing semiconductor material, such as germanium (Ge) or silicon germanium (SiGe), and each of the fin structures 5 may be composed of a silicon containing semiconductor material that does not include germanium, such as silicon (Si). Typically, in this embodiment, the sacrificial semiconductor material 10 is not doped. Referring to FIGS. 4A-4C, a replacement gate structure 15 may then be formed on a channel portion of each of the fin structures 5. The above summation of the process steps depicted in FIGS. 1-4C is not intended to limit this embodiment to only the above description, because the entire process sequence that is described for the pervious embodiments with reference to FIGS. 1-4C is applicable to the present embodiment. For example, each of the fin structures 5 that are employed in the method depicted in FIGS. 1-4C and 11-17 may include a dielectric fin cap 6 (as depicted in FIG. 2) that is removed after forming the sacrificial semiconductor material 10 (as depicted in FIG. 3A) and before forming the replacement (as depicted in FIGS. 4A-4C).

Figure 11:
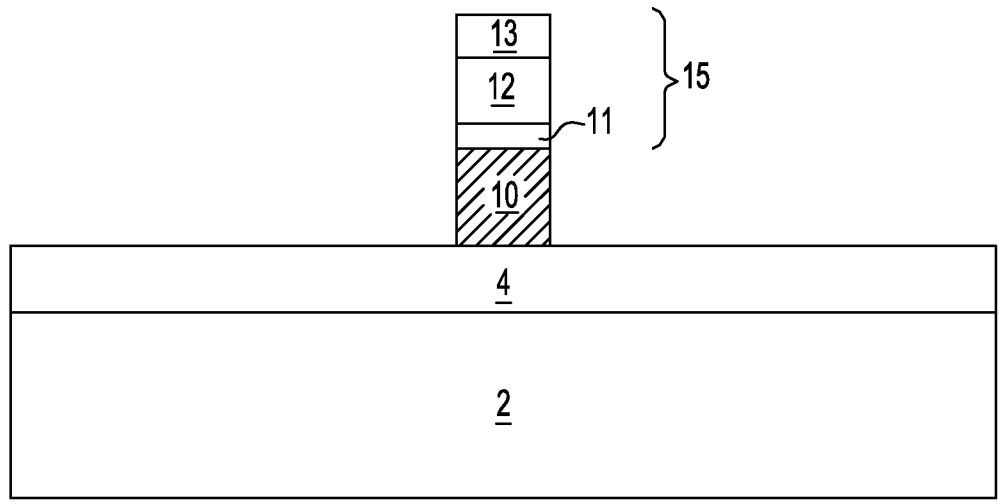
FIG. 11 is a side cross-sectional view through the sacrificial semiconductor material (along section line c-c depicted in FIG. 3B) depicting another embodiment of the present disclosure that includes anisotropically etching the sacrificial semiconductor material depicted in FIG. 4C selectively to at least the replacement gate structure and the fin structures, wherein a remaining portion of the sacrificial semiconductor material is present underlying the replacement gate structure.

FIG. 11 depicts one embodiment of anisotropically etching the sacrificial semiconductor material 10 that is depicted in FIG. 4C with an etch chemistry that is selective to at least the replacement gate structure 15 and the fin structures 5. FIG. 11 is a side cross-sectional view through the sacrificial semiconductor material 10. In one embodiment, a remaining portion of the sacrificial semiconductor material 10 is present underlying the replacement gate structure 15. In one embodiment, the anisotropic etch for removing the exposed portions of the sacrificial semiconductor material 10 may be reactive ion etch (RIE). Other anisotropic etch methods that can be used at this point of the present disclosure include ion beam etching, plasma etching or laser ablation. In one embodiment, the anisotropic etch process for removing the exposed portion of the sacrificial semiconductor material 10 may be selective to the sacrificial gate cap dielectric layer 13, the fin structures 5, and the dielectric surface 4. In some embodiments, because the replacement gate structure 15 functions as an etch mask, the sidewalls of the remaining portion of the sacrificial semiconductor material 10 that are shaped by the anisotropic etch are aligned to the sidewalls of the overlying replacement gate structure 15.

Figure 12A:
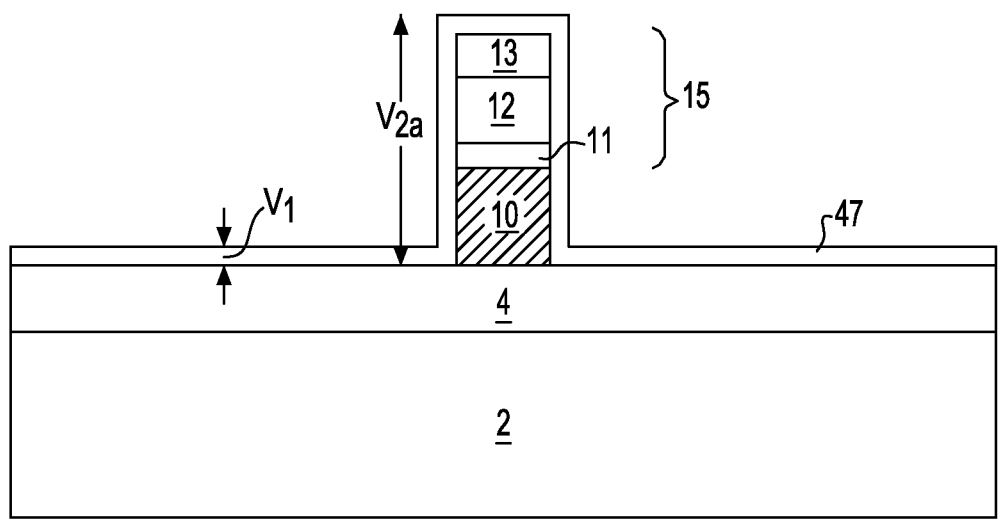
FIG. 12A is a side cross-sectional view through the sacrificial semiconductor material (along section line c-c as depicted in FIG. 3B) depicting forming a conformal dielectric layer on surfaces of the replacement gate structure, the fin structures and the remaining portion of the sacrificial semiconductor material of the structure depicted in FIG. 11, in accordance with one embodiment of the present disclosure.
Figure 12B:
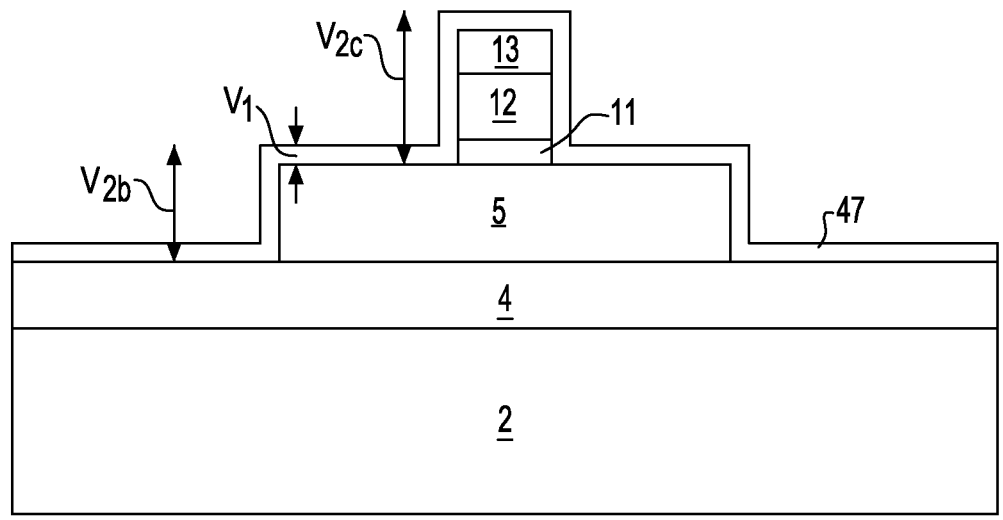
FIG. 12B is a side cross-sectional view through a fin structure of the structure depicted in FIG. 12A (along section line b-b as depicted in FIG. 3B), in accordance with one embodiment of the present disclosure.

FIGS. 12A-14 depict one embodiment of forming a dielectric spacer 50 on sidewalls of the replacement gate structure 15 and the remaining portion of the sacrificial semiconductor material 10. FIGS. 12A and 12B depict one embodiment of depositing a conformal dielectric layer 47 on surfaces of the replacement gate structure 15, the dielectric surface 4, the remaining portion of the sacrificial semiconductor material 10, and the fin structures 5. FIG. 12A is a side cross-sectional view through the sacrificial semiconductor material 10, and FIG. 12B is a side cross-sectional through one of the fin structures 5.

The conformal dielectric layer 47 may be composed of any dielectric material including oxides, nitrides and oxynitride dielectric materials. In one example, the conformal dielectric layer 47 is composed of silicon nitride (SiN), silicon boron nitride (SiBN), or SiCBN. The conformal dielectric layer 47 may be formed using a deposition process, such as chemical vapor deposition (CVD), e.g., plasma enhanced chemical vapor deposition (PECVD) or atomic layer deposition (ALD). In one embodiment, the conformal dielectric layer 47 has a thickness ranging from 2 nm to 15 nm. In another embodiment, the conformal dielectric layer 47 has a thickness ranging from 3 nm to 10 nm.

Figure 13A:
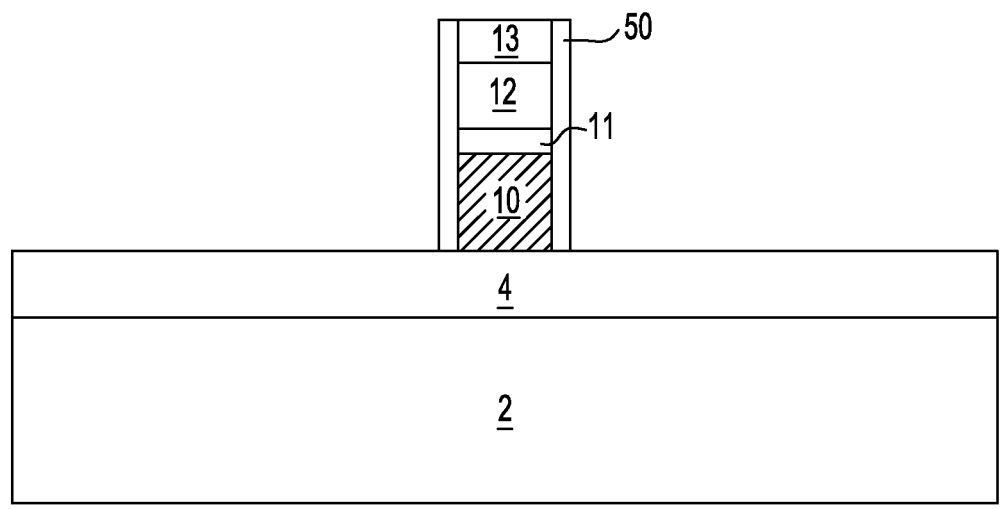
FIG. 13A is a side cross-sectional view through the sacrificial semiconductor material (along section line c-c as depicted in FIG. 3B) depicting one embodiment of anisotropically etching the conformal dielectric layer that is depicted in FIG. 12A, wherein a first remaining portion of the conformal dielectric layer is present on the sidewalls of the replacement gate structure, the sidewalls of the fin structures, and sidewalls of the remaining portion of the sacrificial semiconductor material.
Figure 13B:
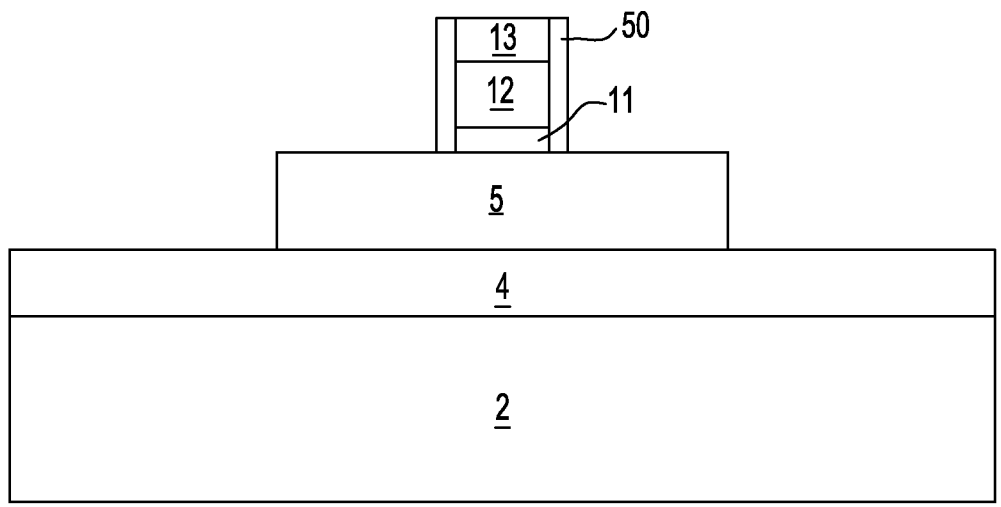
FIG. 13B is a side cross-sectional view through a fin structure of the structure depicted in FIG. 13A (along section line b-b as depicted in FIG. 3B), in accordance with one embodiment of the present disclosure.

FIGS. 13A and 13B depict one embodiment of anisotropically etching the conformal dielectric layer 47, wherein a first remaining portion of the conformal dielectric layer that provides the dielectric spacer 50 is present on the sidewalls of the replacement gate structure 15, the sidewalls of the fin structures 5, and the sidewalls of the remaining portion of the sacrificial semiconductor material 10. FIG. 13A is a side cross-sectional view through the sacrificial semiconductor material 10, and FIG. 13B is a side cross-sectional view through one of the fin structures 5. Examples of anisotropic etch processes that can be applied to the conformal dielectric layer 47 include reactive ion etching (RIE), ion beam etching, plasma etching, laser ablation or a combination thereof. Referring to FIGS. 12A-13B, due to the anisotropic nature of the etch, the lesser vertical thickness V1 of the conformal dielectric layer 47 that is present on the horizontal surfaces of the upper surface of the replacement gate structure 15, the upper surface of the fin structures 5, and the upper surface of the dielectric surface 4 are removed, while the greater vertical thickness V2 of the conformal dielectric layer 47 that is present on the sidewalls of the fin structures 5, the sidewalls of the remaining portion of the sacrificial semiconductor material 10, and the sidewalls of the replacement gate structure 15 remain to provide the dielectric spacer 50.

Figure 14:
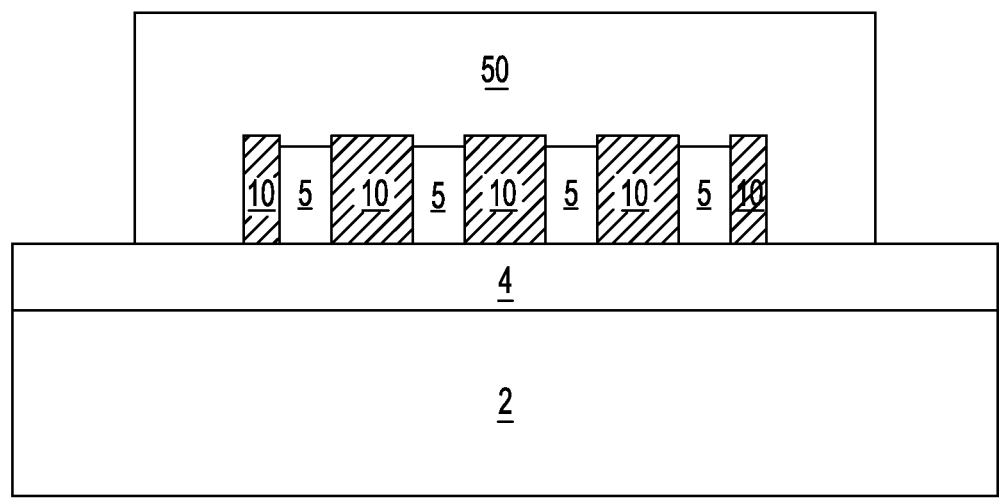
FIG. 14 is a side perspective view of a plurality of fin structures (from point D looking towards the end of the fin structures as depicted in FIG. 3B) depicting removing the first remaining portion of the conformal dielectric layer that is present on the sidewalls of the fin structures, wherein a second remaining portion of the conformal dielectric layer provides a dielectric spacer that is present on the sidewalls of the replacement gate structure and the sidewalls of the remaining portion of the sacrificial semiconductor material.

The anisotropic etch process may be a timed etch process, and may be terminated using endpoint detection techniques. In some embodiments, a remaining portion of the conformal dielectric layer 47 may be removed from the edges of the at least two fin structures 5. The remaining portion of the conformal dielectric layer 47 may be removed from the edges of the at least two fin structures 5 using angled ion implantation to damages the portion of the conformal dielectric layer 47 that is present on the edges of the at least two fin structures 5 followed by a wet etch process. The wet etch process removes the damaged portion of the conformal dielectric layer 47 that is present on the edges of the at least two fin structures 5. The wet etch process may be an etch that is selective to the fin structures 5. FIG. 14 is a side perspective view of a plurality of fin structures 5 looking toward the exposed end, i.e., edges, of the at least two fin structures 5 following removal of damaged portion of the conformal dielectric layer that was present on the edges of the fin structures 5. FIG. 14 is a side perspective view of the edges of the fin structures 5 towards the end of the fin structures 5 depicted in FIG. 3B. In some embodiments, the dielectric spacer 50 can cover the sacrificial semiconductor material 10.

Figure 15:
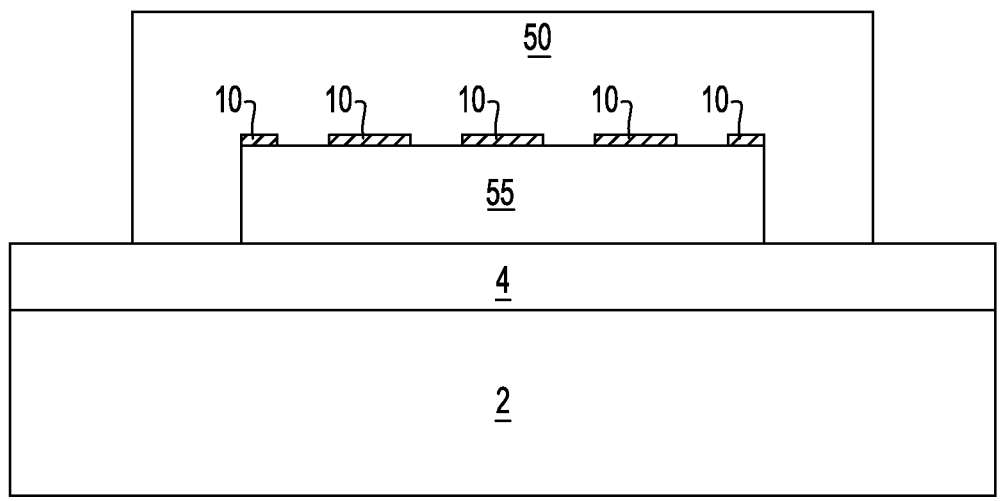
FIG. 15 is a side perspective view of a plurality of fin structures (from point d looking towards the end of the fin structures as depicted in FIG. 3B) depicting forming an epitaxial semiconductor material source and drain region extending from the first sidewall of a first fin structure to a second sidewall an adjacent fin structure.

FIG. 15 depicts one embodiment of forming epitaxial semiconductor material source and drain regions 55 on the exposed sidewalls of the fin structures 5. FIG. 15 is a side perspective view towards the end of the fin structures 5 from the perspective of point "d" as depicted in FIG. 3B. The epitaxial semiconductor material source and drain regions 55 are separated from the replacement gate structure 15 and the remaining portion of the sacrificial semiconductor material 10 by the dielectric spacer 50. The epitaxial semiconductor material source and drain regions 55 are formed using an epitaxial growth process that is similar to the epitaxial growth process that is described above for forming the epitaxial semiconductor material 10 with reference to FIG. 3. Therefore, the description of the epitaxial semiconductor material 10 that is depicted in FIG. 3 is suitable for forming the epitaxial semiconductor material source and drain regions 55 that are depicted in FIG. 15. For example, the epitaxial semiconductor material source and drain regions 55 may be composed of silicon (Si), silicon germanium (SiGe), germanium (Ge), silicon germanium doped with carbon (SiGe:C) and silicon doped with carbon (Si:C). The epitaxial semiconductor material source and drain regions 55 may be in-situ doped with an n-type or p-type dopant, or the epitaxial semiconductor material source and drain regions 55 may be doped with an n-type or p-type dopant using ion implantation. In some embodiments, the epitaxial semiconductor material source and drain regions 55 may extend from the sidewall of a first fin structure 5 to the sidewall of an adjacent fin structure 5, and may be referred to as a "merged" epitaxial semiconductor material source and drain region 55. In some embodiments, the dielectric spacer 50 can cover the sacrificial semiconductor material 10.

Figure 16A:
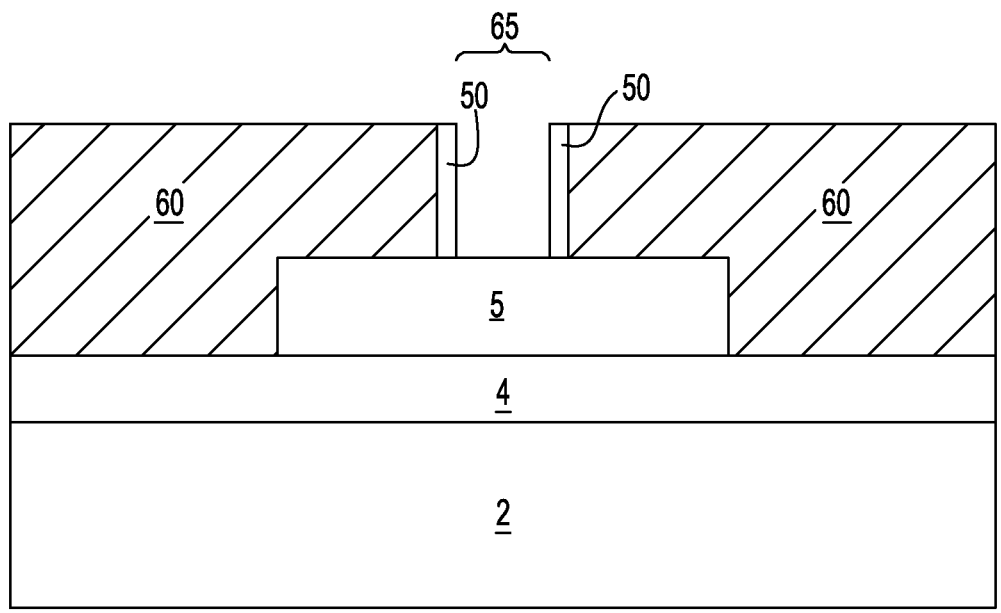
FIG. 16A is a side cross-sectional view through the fin structure (along section line b-b as depicted in FIG. 3B) depicting one embodiment of forming an interlevel dielectric layer over an exposed portion of the fin structures, and removing the replacement gate structure and the remaining portion of the sacrificial semiconductor material selectively to the fin structures, the dielectric surface and the interlevel dielectric layer.
Figure 16B:
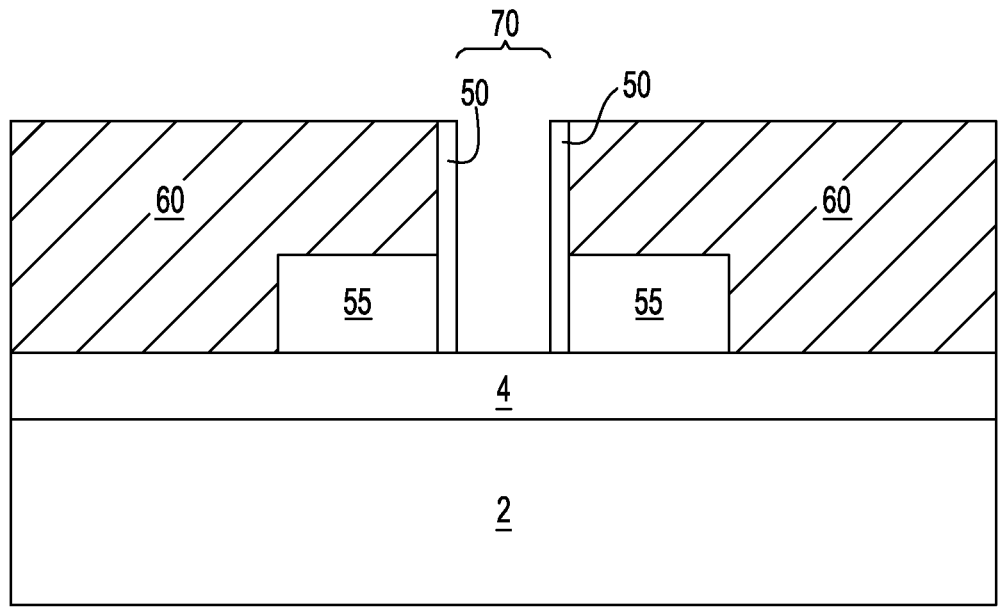
FIG. 16B is a side cross-sectional view of the structure depicted in FIG. 16A through the portion previously occupied by the sacrificial semiconductor material (along section line c-c as depicted in FIG. 3B), in accordance with one embodiment of the present disclosure.

FIGS. 16A and 16B depict one embodiment of forming an interlevel dielectric layer 60 over an exposed portion of the fin structures 5, and removing the replacement gate structure 15 and the remaining portion of the sacrificial semiconductor material 10 selectively to the fin structures 5, the dielectric surface 4 and the interlevel dielectric layer 60. FIG. 16A is a side cross-sectional view through one of the fin structures 5, and FIG. 16B is a side cross-sectional through the portion of the structure from which the remaining portion of the sacrificial semiconductor material 10 was removed. The interlevel dielectric layer 60 that is depicted in FIGS. 16A and 16B is similar to the interlevel dielectric layer 20 that is described above with reference to FIGS. 5A and 5B. Therefore, the above description of the interlevel dielectric layer 20 that is depicted in FIG. 3A is suitable for the interlevel dielectric layer 60 that is depicted in FIGS. 16A and 16B.

In some embodiments, following the formation of the interlevel dielectric layer 60, the replacement gate structure is removed to form a first opening 65 to the fin structures 5 and to expose the remaining portion of the sacrificial semiconductor material 10. The replacement gate structure may be removed with an etch that is selective to the fin structures 5, the dielectric spacer 50 and the interlevel dielectric layer 60. In some embodiments, after removing the replacement gate structure, the remaining portion of the sacrificial semiconductor material 10 may be removed to provide a second opening 70. The second opening 70 may expose a portion of the dielectric surface 4. In one embodiment, the remaining portion of the sacrificial semiconductor material 10 may be removed with an etch that is selective to the at least two fin structures 5, the dielectric spacer 50, the dielectric surface 4 and the interlevel dielectric layer 60. The etch process for removing the remaining portion of the sacrificial semiconductor material 10 may be an anisotropic etch, such as reactive ion etch (RIE), or may be an isotropic etch, such as a wet chemical etch.

Figure 17A:
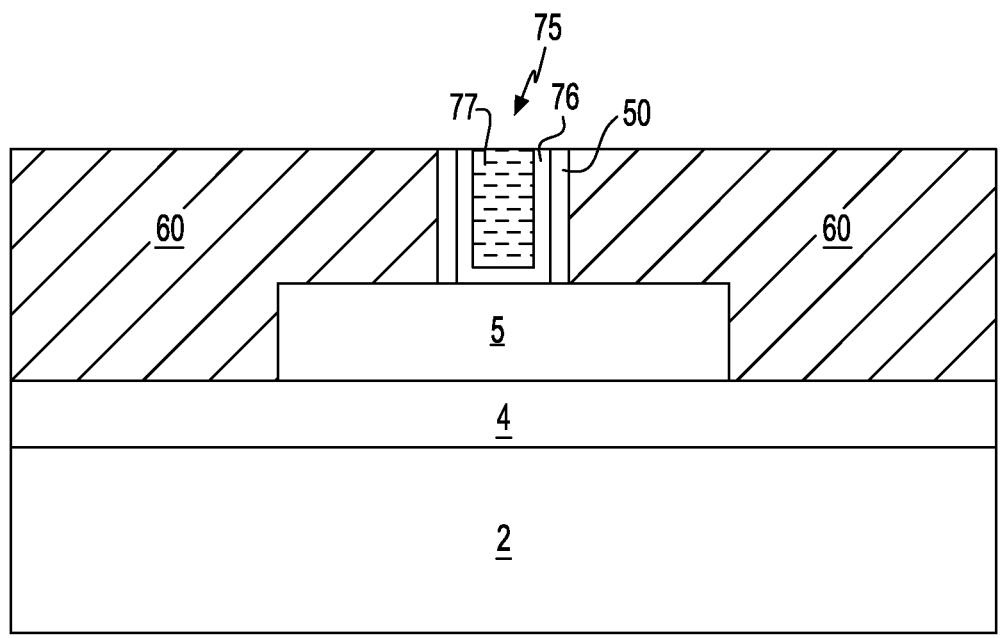
FIG. 17A is a side cross-sectional view through the fin structure (along section line b-b as depicted in FIG. 3B) depicting forming a functional gate structure in the first and second opening depicted in FIGS. 16A and 16B that is provided by removing the replacement gate structure.
Figure 17B:
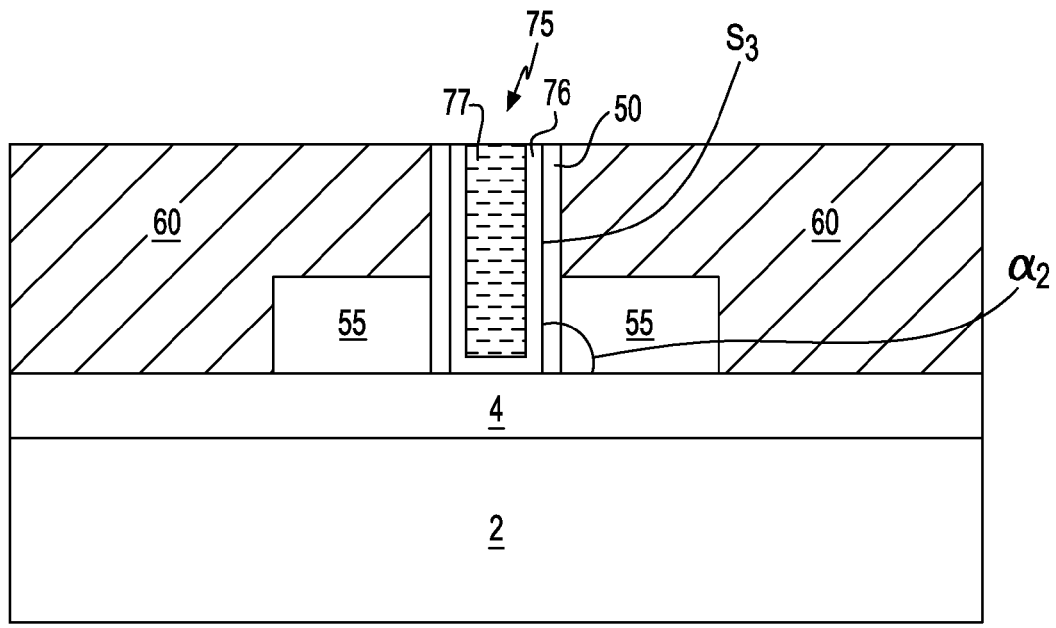
FIG. 17B is a side cross-sectional view of the structure depicted in FIG. 17A through the portion previously occupied by the sacrificial semiconductor material (along section line c-c as depicted in FIG. 3B), in accordance with one embodiment of the present disclosure.

FIGS. 17A and 17B depict one embodiment of forming a functional gate structure 75 in the first opening 65 and the second opening 70. FIG. 17A is a side cross-sectional view through one of the fin structures 5, and FIG. 17B is a side cross-sectional view through the region of the semiconductor device from which the remaining portion of the sacrificial semiconductor material was removed to provide the second opening 70. The functional gate structure 75 including the at least one functional gate dielectric 76 and the at least one functional gate conductor 77 that is depicted in FIGS. 17A and 17B is similar to the functional gate structure 35 including the at least one functional gate dielectric 36 and the at least one functional gate conductor 77 that is described above with reference to FIGS. 8A-8C. Therefore, the description of the functional gate structure 35 that is depicted in FIGS. 8A-8C is suitable for the functional gate structure 75 depicted in FIGS. 17A and 17B. In one embodiment, the dielectric spacer 50 separates the functional gate structure 75 that is depicted in FIG. 17B from the epitaxial semiconductor material source and drain regions 55. Referring to FIG. 17B, in one embodiment, the sidewall S3 of the functional gate structure 75 is substantially perpendicular to the upper surface of the dielectric surface 4, wherein the plane defined by the sidewall S3 of the functional gate structure 75 and a plane defined by an upper surface of the dielectric surface 4 intersect at an angle α2 of 90°+/−10°. In another embodiment, the plane defined by the sidewall S3 of the functional gate structure 75 and a plane defined by an upper surface of the dielectric surface 4 intersect at an angle α2 of 90°+/−5°. In yet another embodiment, the plane defined by the sidewall S3 of the functional gate structure 75 and a plane defined by an upper surface of the dielectric surface 4 intersect at an angle α2 of 90°.

In some embodiments, in the method described with reference to FIGS. 1-4C and FIGS. 11-17B, in which the dielectric fin caps 6 are removed from the fin structures 5, the at least one functional gate dielectric 76 is in direct contact with a sidewall and an upper surface for each of the fin structures 5, and the semiconductor device that is formed by the method is a tri-gate semiconductor device. In other embodiments, in the method described with reference to FIGS. 1-4C and FIGS. 11-17B, in which the dielectric fin caps 6 are not removed from the upper surface of the at least two fin structures 5, the at least one functional gate dielectric 76 is in direct contact with a sidewall for each of the fin structures 5 and is separated from an upper surface for each of the fin structures 5 by the dielectric fin cap. In this embodiment, the semiconductor device is a finFET semiconductor device.

In another embodiment of the present disclosure, a sacrificial semiconductor material 10 that is epitaxially grown on the sidewalls of the fin structures 5 is used to form a spacer 80 that is present only on the sidewalls of the functional gate structure 90, and is not present on the sidewalls of the fin structures 5, as depicted in FIGS. 1-4C, 11, and 18A-21B. Referring to FIGS. 1-4C, the method may begin with forming fin structures 5 comprised of a first semiconductor material on a dielectric surface 4, epitaxially forming a sacrificial semiconductor material 10 of a second semiconductor material on the fin structures 5, and forming a replacement gate structure 15 on a channel portion of each of the fin structures 5. FIG. 11 further depicts anisotropically etching the sacrificial semiconductor material 10 that is depicted in FIG. 4C. The etch process for anisotropically etching the sacrificial semiconductor material 10 may be selective to at least the replacement gate structure 15 and the fin structures 5 so that a remaining portion of the sacrificial semiconductor material 10 is present underlying the replacement gate structure 15. The above summation of the process steps depicted in FIGS. 1-4C and 11 is not intended to limit this embodiment to only the summarized content, because the entire process sequence for the previously described embodiments with reference to FIGS. 1-4C and 11 is applicable to the present embodiment.

Figure 18A:
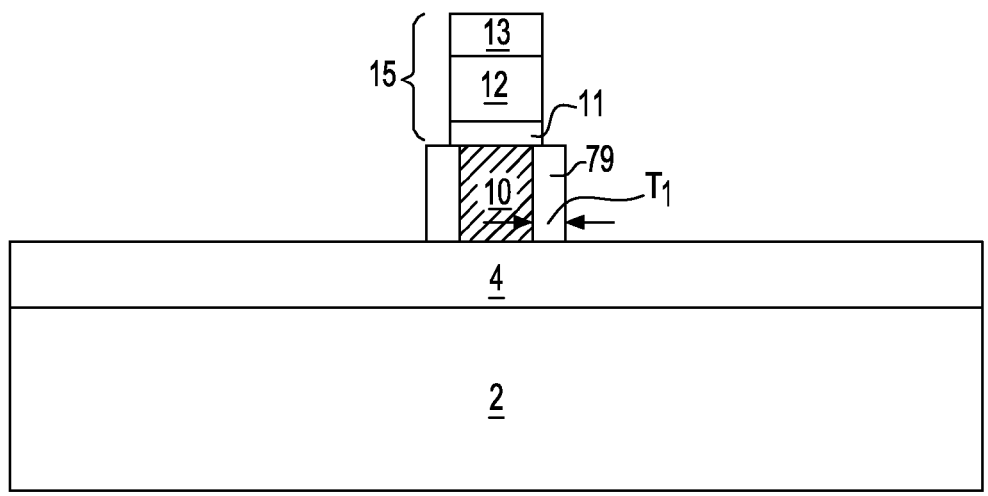
FIG. 18A is a side cross-sectional view through the sacrificial semiconductor material (along section line c-c as depicted in FIG. 3B) depicting another embodiment of the present disclosure that includes oxidizing the remaining portion of the sacrificial semiconductor material depicted in FIG. 11 to form a first oxide having a greater thickness than a second oxide that is present on the fin structures.
Figure 18B:
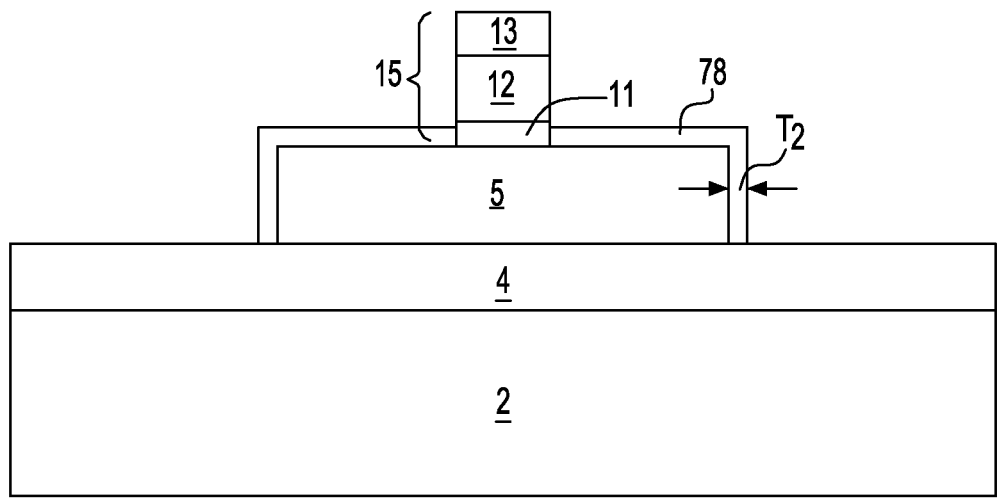
FIG. 18B is a side cross-sectional view of the structure depicted in FIG. 18A through one of the fin structures (along section line b-b as depicted in FIG. 3B) depicting a second oxide that is formed on the fin structures, in accordance with one embodiment of the present disclosure.

FIGS. 18A and 18B depict one embodiment of oxidizing the remaining portion of the sacrificial semiconductor material 10 depicted in FIG. 11 to form a first oxide 79 having a first thickness T1 (as measured from the sidewall S4 of the remaining portion of the sacrificial semiconductor material 10) on the remaining portion of the sacrificial semiconductor material 10 having a greater thickness than a second oxide 78 having a second thickness T2 that is present on the fin structures 5. FIG. 18A is a side cross sectional view through the remaining portion of the sacrificial semiconductor material 10, and FIG. 18B is a side cross sectional view through one of the fin structures 5.

The difference in the thickness between the first oxide 79 that is depicted in FIG. 18A, and the second oxide 78 that is depicted in FIG. 18B, is a function of the oxidation process and the difference between the composition of the sacrificial semiconductor material 10 and the fin structures 5. For example, when the sacrificial semiconductor material 10 is composed of silicon germanium (SiGe) and the fin structures 5 are composed of silicon (Si), the greater oxidation rate of the silicon germanium (SiGe) of the sacrificial semiconductor material 10 in comparison to the oxidation rate of the silicon (Si) of the fin structures 5 results in a first oxide 79 on the sacrificial semiconductor material 10 with a greater thickness than the second oxide 80 on the fin structures 5.

The oxidation process that is applied to the fin structures 5 and the sacrificial semiconductor material 10 may be any thermal oxidation process. Annealing for thermal oxidation may include furnace annealing, rapid thermal annealing and combinations thereof. In some embodiments, thermal oxidation may be carried out at a temperature ranging from 800° C. to 1100° C. for a time period of from 10 seconds to 2 hours in an oxygen containing ambient. In one embodiment, the ambient for thermal oxidation employed includes an oxygen-containing gas, such as $O_2$, air, ozone, NO, $NO_2$ and other like oxygen-containing gases. Mixtures of the aforementioned oxygen-containing gases are also contemplated herein. The oxygen-containing gas may be used alone, or it may be admixed with an inert gas such as He, Ar, $N_2$, Kr, Xe or mixtures thereof.

Referring to FIG. 18A, in one embodiment, the first oxide 79 that is formed on the sacrificial semiconductor material 10 may be a germanium containing oxide. For example, the sacrificial semiconductor material 10 may be composed of silicon (Si), germanium (Ge) and oxygen (O). In one embodiment, the silicon content may range from 20 at. % to 33 at. %, the germanium content may range from 0 at. % to 20 at. %, and the oxygen content may range from 60 at. % to 67 at. %. In another embodiment, the silicon content may range from 25 at. % to 33 at. %, the germanium content may range from 0 at. % to 10 at. %, and the oxygen content may range from 65 at. % to 67 at. %. The thickness of the first oxide 79 may range from 5 nm to 20 nm. In another embodiment, the thickness of the first oxide 79 may range from 5 nm to 10 nm.

Referring to FIG. 18B, in one embodiment, the second oxide 78 that is formed on the fin structures 5 may be silicon oxide. The silicon content may range from 25 at. % to 33 at. %, and the oxygen content may range from 60 at. % to 67 at. %. The second oxide 78 typically does not contain germanium (Ge). The thickness of the second oxide 78 may range from 2 nm to 10 nm. In another embodiment, the thickness of the second oxide 78 may range from 2 nm to 5 nm.

Figure 19:
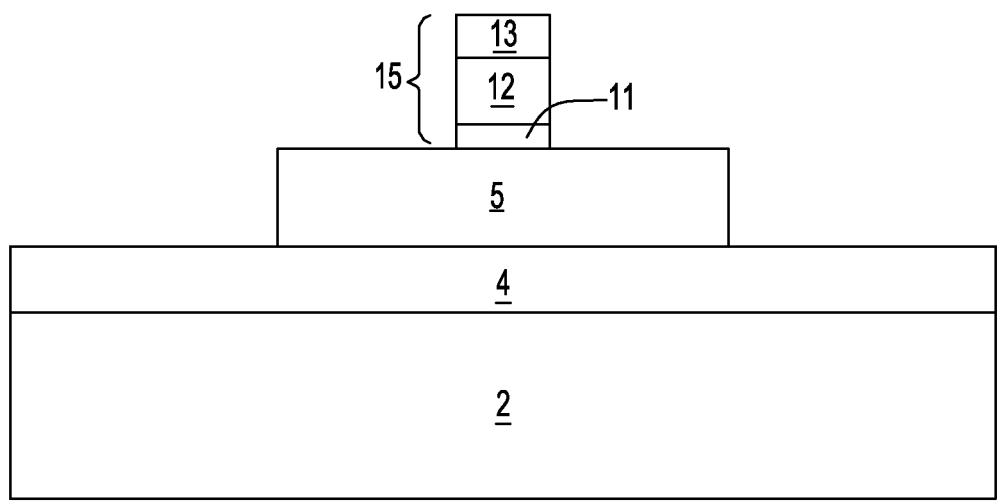
FIG. 19 is a side cross-sectional view through one of the fin structures (along section line b-b as depicted in FIG. 3B) depicting removing the second oxide from the structure depicted in FIG. 18B.

FIG. 19 is a side cross-sectional view through one of the fin structures 5 depicting one embodiment of removing the second oxide 78 from the structure depicted in FIG. 18B. In one embodiment, the etch process for removing the second oxide 78 is selective to at least the fin structures 5. In some embodiments, the etch process for removing the second oxide 78 may also be selective to the replacement gate structure 15 and the dielectric surface 4. The etch process for removing the second oxide 78 may be an isotropic etch process, such as wet etch in an HF containing solution. The etch process for removing the second oxide 78 is typically a timed etch. Because of the greater thickness of the first oxide 79, the second oxide 78 may be removed in its entirety while at least a portion of the first oxide 79 remains to provide the spacer 80 that is present on the sidewalls of the subsequently formed functional gate structure, as depicted in FIGS. 20B and 21B. The removed thickness from the first oxide 79, i.e., amount etched, that results from the etch process that removes the second oxide 78 may range from 2 nm to 10 nm. In one embodiment, the removed thickness from the first oxide 79, i.e., amount etched, that results from the etch process that removes the second oxide 78 may range from 2 nm to 5 nm.

Figure 20A:
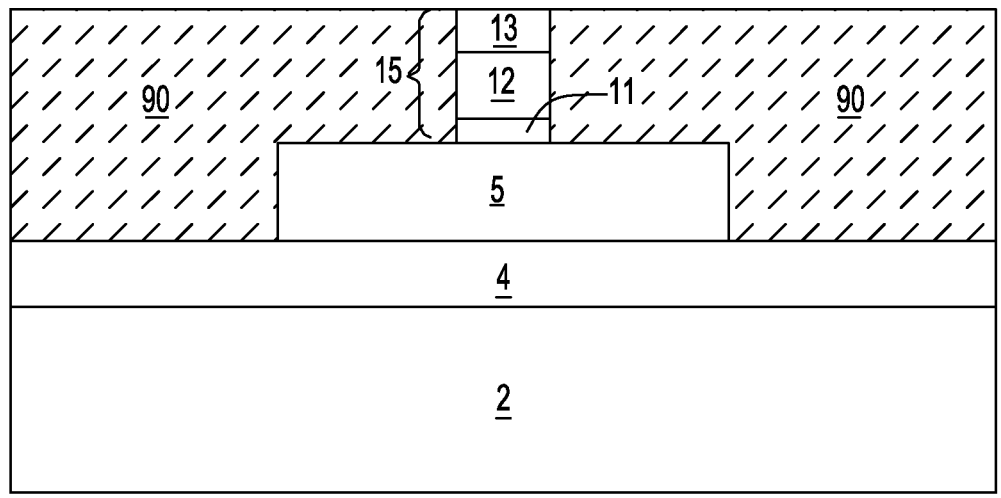
FIG. 20A is a side cross-sectional view through one of the fin structures (along section line b-b as depicted in FIG. 3B) depicting one embodiment of forming an epitaxial semiconductor material source and drain region extending from the first sidewall of a first fin structure to a second sidewall an adjacent fin structure, and forming an interlevel dielectric layer over an exposed portion of the fin structures depicted in FIG. 19.
Figure 20B:
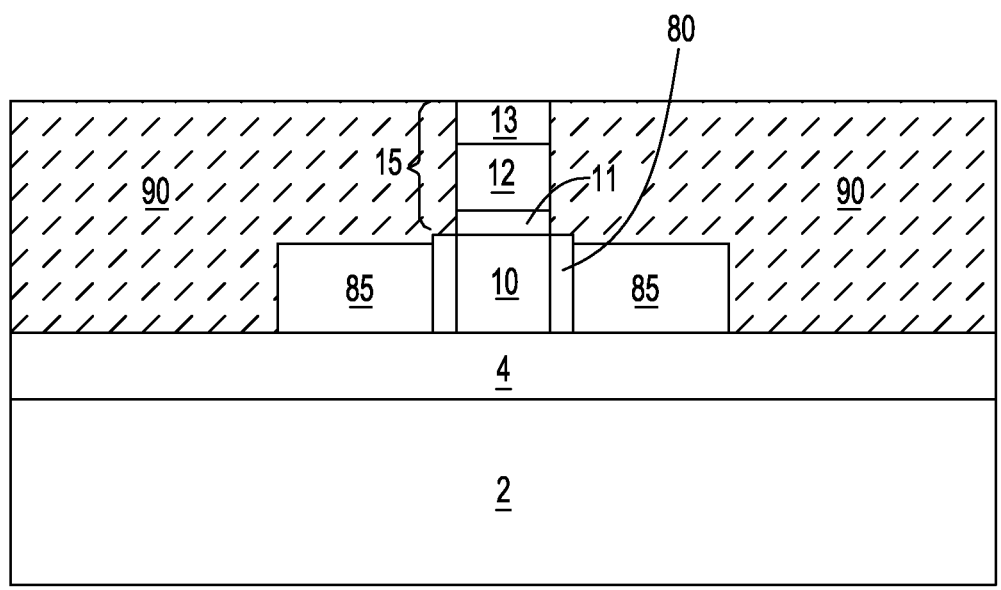
FIG. 20B is a side cross-sectional view through the sacrificial semiconductor material of the structure depicted in FIG. 20A (along section line c-c as depicted in FIG. 3B).

FIGS. 20A and 20B depict one embodiment of forming an epitaxial semiconductor material source and drain region 85 extending from a first sidewall of a first fin structure 5 to a second sidewall an adjacent fin structure 5, and forming an interlevel dielectric layer 90 over an exposed portion of the fin structures 5 depicted in FIG. 19. FIG. 20A is a side cross-sectional view through one of the fin structures 5 and FIG. 20B is a side cross-sectional view through the sacrificial semiconductor material 10. The epitaxial semiconductor material source and drain regions 85 are similar to the epitaxial semiconductor material source and drain regions 55 that are described with reference to FIG. 15. Therefore, the description of the epitaxial semiconductor material source and drain regions 55 that are depicted in FIG. 15 is suitable for the epitaxial semiconductor material source and drain regions 85 that are depicted in FIGS. 20A and 20B. The interlevel dielectric layer 90 is similar to interlevel dielectric layer 20 that is depicted in FIG. 3A. Therefore, the above description of the interlevel dielectric layer 20 that is depicted in FIG. 3A is suitable for the interlevel dielectric layer 90 that is depicted in FIGS. 20A and 20B.

Figure 21A:
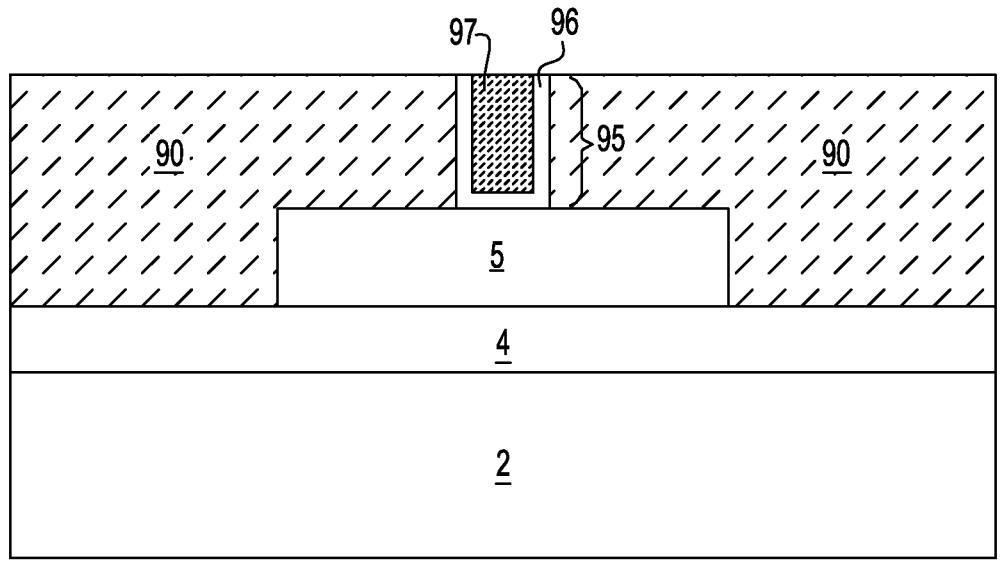
FIG. 21A is a side cross-sectional view through the fin structure (along section line B-B as depicted in FIG. 3B) depicting one embodiment of removing the replacement gate structure and the remaining portion of the sacrificial semiconductor material depicted in FIGS. 20a and 20b, and forming a functional gate structure.
Figure 21B:
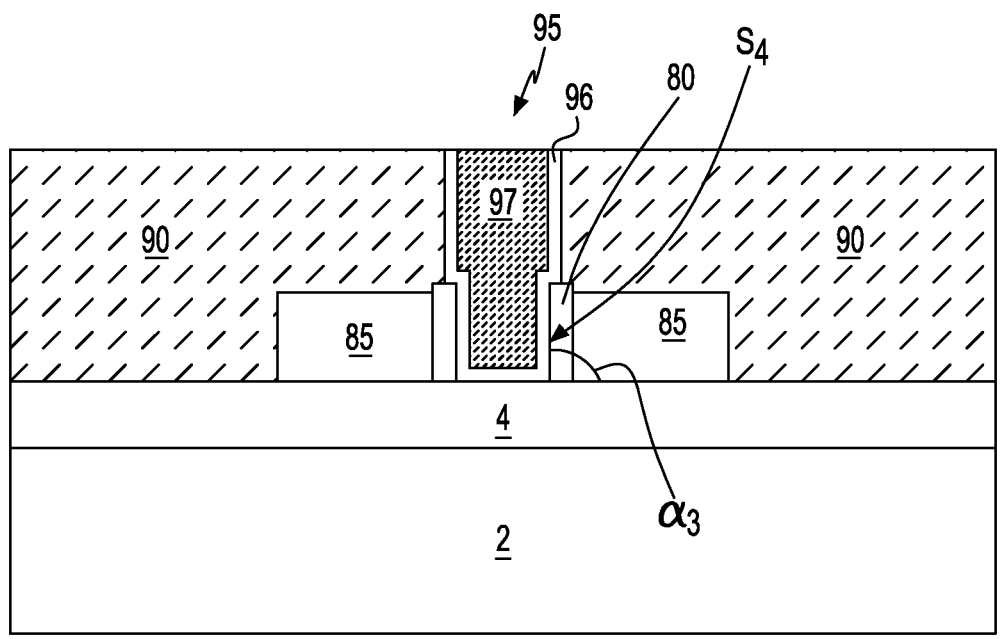
FIG. 21B is a side cross-sectional view of the structure depicted in FIG. 21A the portion previously occupied by the sacrificial semiconductor material (along section line c-c as depicted in FIG. 3B).

FIGS. 21A and 21B depict one embodiment of removing the replacement gate structure 15 and the remaining portion of the sacrificial semiconductor material 10 to form a first opening exposing the fin structures 5 and a second opening exposing the dielectric surface 4, and forming a functional gate structure 95 in the first and second openings that is in direct contact with a channel portion of the fin structures 5. FIG. 21A is a side cross-sectional view through the fin structure 5, and FIG. 21B is a side cross-sectional view through the portion of the structure from which the sacrificial semiconductor material was removed. The replacement gate structure 15 may be removed with an etch that is selective to the fin structures 5, the dielectric spacer 80 and the interlevel dielectric layer 60 to provide the first opening. In some embodiments, after removing the replacement gate structure 15, the remaining portion of the sacrificial semiconductor material 10 may be removed to provide the second opening. In one embodiment, the remaining portion of the sacrificial semiconductor material 10 may be removed with an etch that is selective to the fin structures 5, the dielectric spacer 80, the dielectric surface 4 and the interlevel dielectric layer 90. Further details regarding the etch processes for removing the replacement gate structure 15 and the remaining sacrificial semiconductor material 10 are discussed above with respect to the prior embodiments.

The functional gate structure 95 including the at least one functional gate dielectric 96 and the at least one functional gate conductor 97 that is depicted in FIGS. 21A and 21B is similar to the functional gate structure 35 including the at least one functional gate dielectric 36 and the at least one functional gate conductor 77 that is described above with reference to FIGS. 8A-8C. Therefore, the description of the functional gate structure 35 that is depicted in FIGS. 8A-8C is suitable for the functional gate structure 95 depicted in FIGS. 21A and 21B.

Referring to FIGS. 21A and 21B, the dielectric spacer 80, e.g., dielectric spacer 80 that is composed of a germanium-containing oxide, may extend from a first fin structure 5, e.g., fin structure 5 composed of silicon, to an adjacent fin structure 5, e.g., fin structure 5 composed of silicon. The dielectric spacer 80 is present only on the sidewalls of the functional gate structure 95, but is not present on the sidewalls of the fin structures 5. The dielectric spacer 80 is in direct contact with the at least one functional gate dielectric layer 96 of the functional gate structure 95. The dielectric spacer 80 may have an upper surface that is substantially coplanar with an upper surface of the fin structures 5. Referring to FIG. 21B, in one embodiment, the sidewall S4 of the functional gate structure 95 is substantially perpendicular to the upper surface of the dielectric surface 4, wherein the plane defined by the sidewall S4 of the functional gate structure 95 and a plane defined by an upper surface of the dielectric surface 4 intersect at an angle α3 of 90°+/−10°. In another embodiment, the plane defined by the sidewall S4 of the functional gate structure 95 and a plane defined by an upper surface of the dielectric surface 4 intersect at an angle α3 of 90°+/−5°. In yet another embodiment, the plane defined by the sidewall S4 of the functional gate structure 95 and a plane defined by an upper surface of the dielectric surface 4 intersect at an angle α3 of 90°.

In some embodiments, in the method described with reference to FIGS. 1-4C, 11 and 18A-21B, in which the dielectric fin caps 6 are removed from the fin structures 5, the at least one functional gate dielectric 96 is in direct contact with a sidewall and an upper surface for each of the fin structures 5, and the semiconductor device that is formed by the method is a tri-gate semiconductor device. In other embodiments, in the method described with reference to FIGS. 1-4C, 11 and 18A-21B, in which the dielectric fin caps 6 are not removed from the upper surface of the fin structures 5, the at least one functional gate dielectric 96 is in direct contact with a sidewall for each of the fin structures 5 and is separated from an upper surface for each of the fin structures 5 by the dielectric fin cap. In this embodiment, the semiconductor device is a finFET semiconductor device.

While the present disclosure has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A semiconductor device comprising:
   at least two fin structures present on a substrate surface;
   a gate structure present on the at least two fin structures, wherein the gate structure includes at least one high-k gate dielectric that is in direct contact with at least the sidewalls of the two fin structures, and at least one gate conductor on the at least one high-k gate dielectric;
   a dielectric spacer having a dielectric constant that is less than the dielectric constant of the high-k gate dielectric, the dielectric spacer extends from a first fin structure to an adjacent fin structure and has an upper surface that is substantially coplanar with an upper surface of the at least two fin structures, wherein an entirety of a first sidewall surface of the dielectric spacer is in direct contact with the at least one high-k gate dielectric of the gate structure; and
   an epitaxial semiconductor material in direct contact with the at least two fin structures and separated from the gate structure by the dielectric spacer, wherein an entirety of a second sidewall surface of the dielectric spacer that is opposite the first sidewall surface directly contacts a sidewall surface of the epitaxial semiconductor material and wherein a bottommost surface of the dielectric spacer is coplanar with a bottommost surface of the high-k gate dielectric.

2. The semiconductor device of claim 1, wherein the gate structure has a sidewall that is perpendicular to the substrate surface.

3. The semiconductor device of claim 1, wherein the epitaxial semiconductor material provides a source region and a drain region to the semiconductor device.

4. The semiconductor device of claim 1, wherein the at least one high-k gate dielectric is in direct contact with a sidewall and an upper surface for each of the at least two fin structures, and the semiconductor device is a tri-gate semiconductor device.

5. The semiconductor device of claim 2, wherein a dielectric fin cap is present on the upper surface of each of the at least two fin structures, the at least one high-k gate dielectric is in direct contact with a sidewall for each of the at least two fin structures and is separated from an upper surface for each of the at least two fin structures by the dielectric fin cap, and the semiconductor device is a finFET semiconductor device.

6. The semiconductor structure of claim 1, wherein a topmost surface of the dielectric spacer is coplanar with a topmost surface of the epitaxial semiconductor material.

7. The semiconductor structure of claim 1, wherein the dielectric spacer has a width from 2 nm to 10 nm.

8. The semiconductor structure of claim 1, wherein the functional gate structure is in direct contact with the dielectric spacer.

9. The semiconductor structure of claim 1, wherein the substrate is a dielectric material.

10. The semiconductor structure of claim 1, wherein the substrate comprises a semiconductor material.

11. The semiconductor structure of claim 1, wherein the two fin structures comprises a crystalline semiconductor material.

12. The semiconductor structure of claim 1, wherein each of the fin structures comprise a first semiconductor material and the epitaxial semiconductor material comprises a second semiconductor material that differs in composition from the first semiconductor material.

13. The semiconductor structure of claim 1, wherein the first semiconductor material comprises silicon, and the second semiconductor material comprises silicon germanium or germanium.

14. The semiconductor structure of claim 1, wherein the epitaxial semiconductor merges the two fin structures.

15. The semiconductor structure of claim 1, wherein the at least one high-k gate dielectric has a dielectric constant from 10 to 40, and the dielectric spacer has a dielectric constant from 3 to 7.

* * * * *